United States Patent
Aihara et al.

(10) Patent No.: US 9,337,218 B2
(45) Date of Patent: May 10, 2016

(54) LIQUID CRYSTAL DISPLAY DEVICE AND MANUFACTURING METHOD THEREOF

(71) Applicant: SEMICONDUCTOR ENERGY LABORATORY CO., LTD., Atsugi-shi, Kanagawa-ken (JP)

(72) Inventors: Yamato Aihara, Tochigi (JP); Masami Jintyou, Tochigi (JP); Rai Sato, Tochigi (JP); Toru Arakawa, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 130 days.

(21) Appl. No.: 14/038,899

(22) Filed: Sep. 27, 2013

(65) Prior Publication Data
US 2014/0024154 A1  Jan. 23, 2014

Related U.S. Application Data
(62) Division of application No. 13/103,147, filed on May 9, 2011, now Pat. No. 8,605,240.

(30) Foreign Application Priority Data
May 20, 2010  (JP) ................................. 2010-115983

(51) Int. Cl.
G02F 1/1333  (2006.01)
G02F 1/1335  (2006.01)
G02F 1/13  (2006.01)
(Continued)

(52) U.S. Cl.
CPC ...... H01L 27/1262 (2013.01); G02F 1/133553 (2013.01); G02F 1/13725 (2013.01)

(58) Field of Classification Search
CPC .................... G02F 1/133553; G02F 1/133707; G02F 2001/133776; H01L 21/02315; H01L 21/3065; H01L 21/32136
USPC .................................. 349/113, 122, 138, 187
See application file for complete search history.

(56) References Cited

U.S. PATENT DOCUMENTS 4,400,725 A  8/1983  Tanigaki
4,431,272 A *  2/1984  Yazawa et al. ................ 349/113
(Continued)

FOREIGN PATENT DOCUMENTS

CN  001716009 A  1/2006
EP  0586220 A  3/1994
(Continued)

OTHER PUBLICATIONS

Taiwanese Office Action (Application No. 100116349) Dated Oct. 23, 2014.
(Continued)

Primary Examiner — Nathanael R Briggs
(74) Attorney, Agent, or Firm — Nixon Peabody LLP; Jeffrey L. Costellia

(57) ABSTRACT

In the liquid crystal display device in which a guest-host liquid crystal layer is provided between a first substrate having a reflective film which is a pixel electrode layer (also referred to as a first electrode layer) and a second substrate having a common electrode layer (also referred to as a second electrode layer), the reflective film which is a pixel electrode layer is projected into the liquid crystal layer, and a micron-sized first unevenness and a nano-sized second unevenness on the first unevenness are provided.

12 Claims, 9 Drawing Sheets

(51) Int. Cl.
*H01L 27/12* (2006.01)
*G02F 1/137* (2006.01)

(56) References Cited

U.S. PATENT DOCUMENTS

| | | | |
|---|---|---|---|
| 4,928,301 A | 5/1990 | Smoot | |
| 5,159,445 A | 10/1992 | Gitlin et al. | |
| 5,406,323 A | 4/1995 | Tanigaki et al. | |
| 5,526,149 A | 6/1996 | Kanbe et al. | |
| 5,532,736 A | 7/1996 | Kuriki et al. | |
| 5,815,197 A | 9/1998 | Kakii | |
| 6,005,604 A | 12/1999 | Kakii | |
| 6,055,028 A | 4/2000 | Nishi et al. | |
| 6,107,639 A | 8/2000 | Yamazaki et al. | |
| 6,137,526 A | 10/2000 | Kakii | |
| 6,163,055 A | 12/2000 | Hirakata et al. | |
| 6,278,884 B1 | 8/2001 | Kim | |
| 6,473,631 B1 | 10/2002 | Siddoway et al. | |
| 6,628,320 B2 | 9/2003 | Mukai et al. | |
| 6,646,672 B2 | 11/2003 | Feierbach | |
| 6,697,129 B1 | 2/2004 | Nishi et al. | |
| 6,879,354 B1 | 4/2005 | Sawayama et al. | |
| 6,882,388 B2 | 4/2005 | Sugiura et al. | |
| 7,019,714 B2 | 3/2006 | Uchida et al. | |
| 7,162,209 B2 | 1/2007 | Ono | |
| 7,480,019 B2 | 1/2009 | Itami et al. | |
| 7,511,776 B2 | 3/2009 | Nishi et al. | |
| 7,593,075 B2 | 9/2009 | Kudou et al. | |
| 7,821,613 B2 | 10/2010 | Kimura | |
| 7,916,167 B2 | 3/2011 | Miyagawa et al. | |
| 8,634,044 B2 | 1/2014 | Kimura | |
| 2002/0001047 A1 | 1/2002 | Park et al. | |
| 2003/0193288 A1 | 10/2003 | Pavlovsky | |
| 2004/0051826 A1* | 3/2004 | Lee | 349/113 |
| 2004/0189794 A1 | 9/2004 | Rambo et al. | |
| 2004/0257473 A1 | 12/2004 | Miyagawa | |
| 2005/0190322 A1 | 9/2005 | Okabe et al. | |
| 2007/0146592 A1* | 6/2007 | Kimura | B82Y 20/00 349/114 |
| 2014/0132872 A1 | 5/2014 | Kimura | |

FOREIGN PATENT DOCUMENTS

| | | |
|---|---|---|
| JP | 06-075237 A | 3/1994 |
| JP | 08-340520 | 12/1996 |
| JP | 2002-296585 | 10/2002 |
| JP | 3408154 | 5/2003 |
| JP | 2006-221055 A | 8/2006 |
| JP | 2007-199708 A | 8/2007 |

OTHER PUBLICATIONS

Lee, et al., "9.3: 2.2" QCIF Full Color Transparent AMOLED Display", SID Digest '03 : SID International Symposium Digest of Technical Papers, May 1, 2003, vol. 34, pp. 104-107.

* cited by examiner

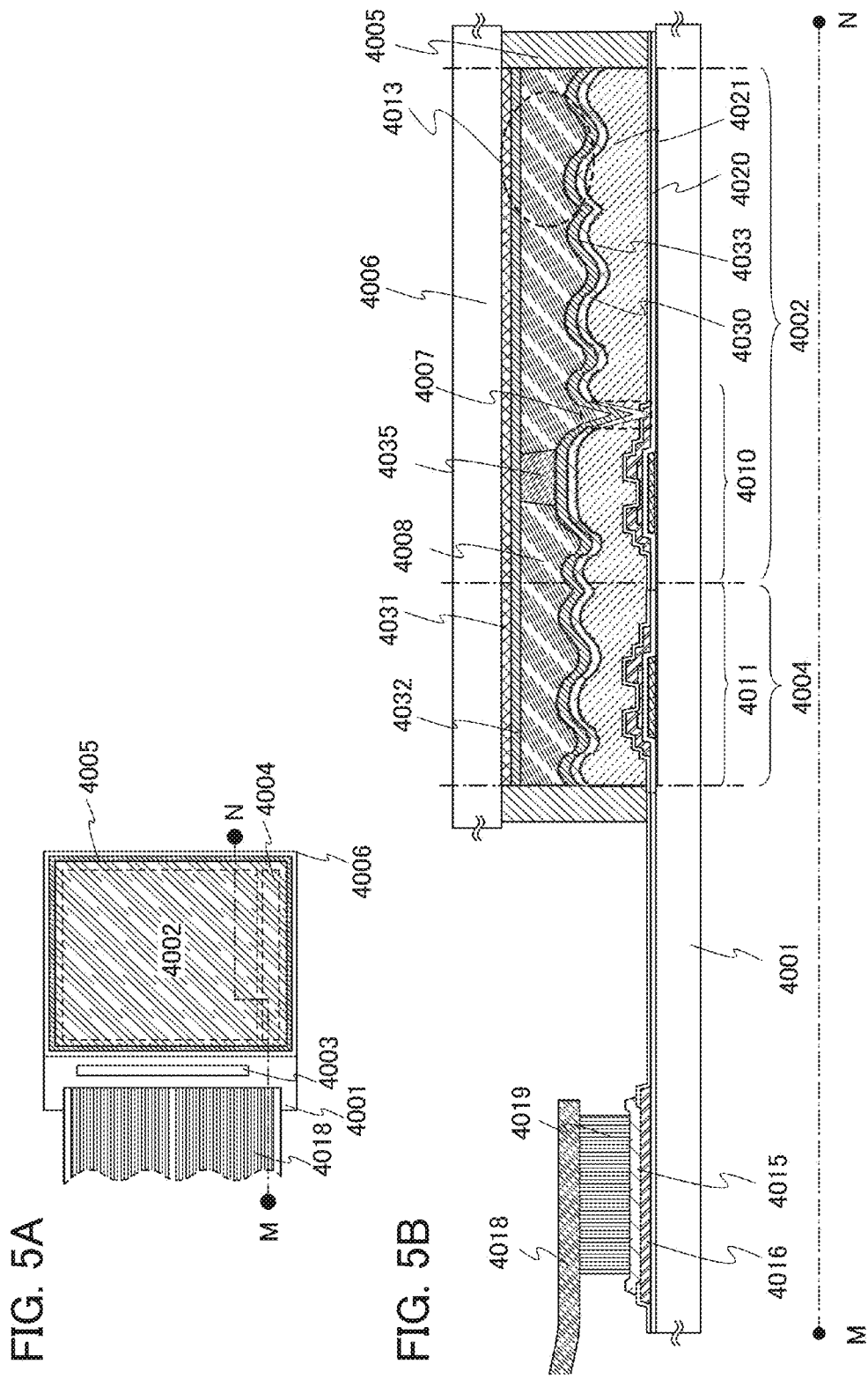

LIQUID CRYSTAL DISPLAY DEVICE AND MANUFACTURING METHOD THEREOF

BACKGROUND OF THE INVENTION

1. Field of the Invention

The present invention relates to a liquid crystal display device and a manufacturing method thereof.

2. Description of the Related Art

As a display device which is thin and lightweight (a so-called flat panel display), a liquid crystal display device including a liquid crystal element, a light-emitting device including a self-luminous element, a field-emission display (an FED), and the like have been competitively developed.

Since many optical members such as a polarizing plate and a backlight are used in a liquid crystal display device widely used as a display device, material cost or power consumption of the backlight needs to be reduced.

In addition, a liquid crystal display device has various modes, and a TN mode using a nematic liquid crystal in the twist alignment or an STN mode using a nematic liquid crystal in the supertwist alignment is mainly used. However, a pair of polarizing plates is required by the operating principle of these modes, and thus transmittance is low and bright display cannot be obtained due to the light absorption by the polarizing plates.

Further, other than these modes, a guest-host liquid crystal using a dichroic pigment has been developed. In a display device using a guest-host liquid crystal, dichroic pigments are mixed as guest molecules with host molecules in a liquid crystal layer, and each alignment of the host molecule and the guest molecule is changed by voltage applied to the liquid crystal, so that the light absorptance of the liquid crystal layer is changed. A rod-like dichroic pigment has a property of being oriented in parallel with the host molecule, when the dichroic pigment is used as a guest molecule. Accordingly, for example when the alignment of the host molecule is changed by applying voltage, the alignment of the dichroic pigment is concomitantly changed.

In addition, a reflective liquid crystal display device in which the guest-host liquid crystal and a reflective film, or the guest-host liquid crystal and a reflective plate, are combined has been developed. In the reflective liquid crystal display device, images can be displayed without using a backlight source (a backlight) and can be displayed only with external light, so that low power consumption can be achieved. In addition, since the reflective liquid crystal display device can be widely used for a display of a mobile information terminal and the like, and it has been researched for practical use.

One of the main components of the reflective liquid crystal display device using the guest-host liquid crystal is a reflective film or a reflective plate for reflecting light.

A conventional reflective film reflects incident light by specular reflection, so that when a panel is observed from the front, vertical incident light is reflected to the viewer side as vertical reflective light, whereby favorable display can be obtained. However, when the panel is observed from an oblique angle, incident light is hardly reflected to the viewer side, so that display visibility dropped. Further, when the reflecting surface is specular, the reflected image is seen in the display background, so that the display is hard to see.

As a measure against the problems, a reflective film having uneven shape in accordance with uneven shape which is made in a surface of a resin layer has been proposed (see Patent Document 1, for example). Accordingly, light incident from outside is scattered by using the reflective film, and a high reflecting property and display with high brightness can be realized.

REFERENCE

[Patent Document 1] Japanese Patent Application No. 2002-296585

According to Patent Document 1, the uneven surface of the resin layer is formed by using a photosensitive resin for the resin layer and changing the irradiation energy in a light-exposure condition. Then, the distribution of thermal deformation characteristics of the resin layer is adjusted by performing heat treatment such that the uneven surface of the resin layer is formed, and a film having high reflecting property is formed along the uneven surface, so that the reflective film is formed. However, in the reflective film disclosed in Patent Document 1, only a comparatively large uneven shape can be formed, and a high reflecting property with enough stability has not yet been realized with this reflective film.

In view of the above problem, it is an object of the present invention to provide a guest-host liquid crystal display device including a reflective film having a high reflecting property with stability and a manufacturing method thereof.

SUMMARY OF THE INVENTION

In a reflective guest-host liquid crystal display device, a surface of a reflective pixel electrode layer that is in contact with a liquid crystal layer is made uneven, and the uneven surface has a micron-sized first uneven shape and a nano-sized second uneven shape. Details thereof are described below.

An embodiment of the present invention is a liquid crystal display device including: a pair of substrates with a guest-host liquid crystal provided therebetween; a light-transmitting electrode provided over one of the pair of substrates; an insulating layer provided over the other of the pair of substrates and having a first unevenness and a second unevenness on a surface of the first unevenness; and a pixel electrode layer formed along the surface of the first unevenness on the insulating layer and having an uneven surface due to the second unevenness, in which the pixel electrode layer has a reflective property.

A photosensitive organic resin may be used for the insulating layer in the above structure. Further, the first unevenness on the insulating layer has a size of greater than or equal to 1.5 μm and less than or equal to 20 μm in a planar direction and a height of greater than or equal to 0.1 μm and less than or equal to 20 p.m.

In addition, in the above structure, the second unevenness over the insulating layer has a size of greater than or equal to 0.1 μm and less than or equal to 1 μm in a planar direction a height of greater than or equal to 0.1 μm and less than or equal to 1 p.m. In such a manner, the second unevenness can be smaller than the first unevenness.

A reflective film is formed over the insulating layer having the first unevenness and the second unevenness, so that the reflective pixel electrode layer can be formed. A resin layer having the first unevenness is formed and subjected to plasma treatment, so that the insulating layer used as a base film for the reflective pixel electrode layer can have the second unevenness on the first unevenness.

According to the size, the first unevenness and the second unevenness may be referred to as a micron-sized unevenness and a nano-sized unevenness, respectively, in this specification and the like.

In addition, the pixel electrode layer formed along the insulating layer may have a thickness of greater than or equal to 5 nm and less than or equal to 500 nm in the above structure.

In addition, a guest-host liquid crystal layer includes a dichroic pigment as a guest molecule and a nematic liquid crystal as a host molecule in the above structure.

Further, in a liquid crystal display device using the guest-host liquid crystal, the guest molecule that is a dichroic pigment absorbs light and black is displayed, so that a polarizing plate is not needed. Thus, light absorption by a polarizing plate is not performed, whereby white can be favorably displayed.

In addition, a transistor may be provided between the other of the pair of substrates and the pixel electrode layer and electrically connected to the pixel electrode layer in the above structure.

Further, an oxide semiconductor layer may be used for the transistor in the above structure.

Another embodiment of the present invention disclosed in this specification is a manufacturing method of a liquid crystal display device including the steps of: forming a first unevenness on a photosensitive organic resin layer; forming a second unevenness on the first unevenness by plasma treatment; and forming a reflective pixel electrode layer along the first unevenness and the second unevenness.

The plasma treatment for forming the second unevenness may be performed on an organic resin layer having the first unevenness under an oxygen gas atmosphere in the above structure.

In the plasma treatment for forming the second unevenness, a dry etching apparatus (also referred to as an ashing apparatus) may be used. Further, at least one of a type of gas, a gas flow rate, a pressure, a temperature, a high-frequency power, a treatment time in the dry etching apparatus is changed, so that the size and the height of the second unevenness can be controlled.

A guest-host liquid crystal display device including a reflective film having a high reflecting property can be realized with stability and a manufacturing method thereof can be provided.

Thus, high contrast can be obtained and eye-friendly display close to paper that causes less eyestrain can be realized.

BRIEF DESCRIPTION OF THE DRAWINGS

In the accompanying drawings:

FIGS. 5A and 5B are diagrams showing one embodiment of a liquid crystal display module;

DETAILED DESCRIPTION OF THE INVENTION

Figure 1:
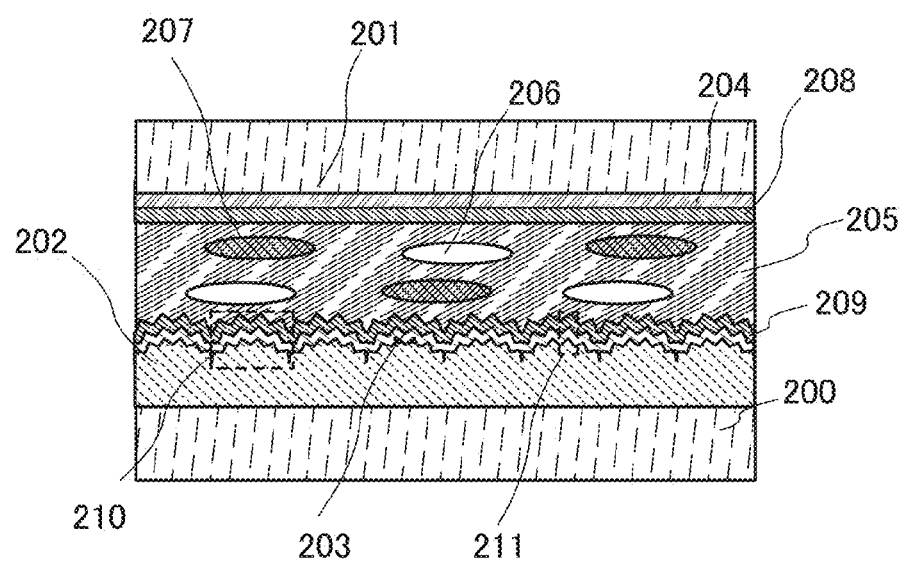
FIG. 1 is a diagram showing one embodiment of a liquid crystal display device.

Embodiments will be described in detail with reference to the accompanying drawings. Note that the present invention is not limited to the following description, and it is apparent to those skilled in the art that modes and details can be modified in various ways without departing from the spirit and scope of the present invention. Therefore, the present invention should not be construed as being limited to the description in the following embodiments. Note that in the structures explained below, the same portions or portions having similar functions to each other are denoted by the same reference numerals in different drawings, and the description of such portions is not repeated.

Note that the ordinal numbers such as "first" and "second" in this specification are used for convenience and do not denote the order of steps and the stacking order of layers. In addition, the ordinal numbers in this specification do not denote particular names that specify the present invention.

(Embodiment 1)

A liquid crystal display device that is one embodiment of a structure of the invention disclosed in this specification will be described with reference to FIG. 1. FIG. 1 is a cross-sectional view of a liquid crystal display device.

FIG. 1 shows a liquid crystal display device including a liquid crystal layer 205 provided between a first substrate 200 provided with an alignment film 209, a pixel electrode layer 203, and an insulating layer 202 and a second substrate 201 provided with a common electrode layer 204 and an alignment film 208.

A micron-sized first unevenness 210 is provided on the insulating layer 202 formed over the first substrate 200, and further a surface of the first unevenness 210 is provided with a nano-sized second unevenness 211. Further, the pixel electrode layer 203 having a reflective property is formed along the shape of the first unevenness 210 and the second unevenness 211 formed on the insulating layer 202. The alignment film 209 for controlling the alignment of the liquid crystals of the liquid crystal layer 205 is formed over the pixel electrode layer 203.

Further, on the insulating layer 202, the size and the height of the unevenness of the surface of the pixel electrode layer 203 can be controlled by controlling an area, a formation position, and a height of the projecting portion of the micron-sized first unevenness, so that the image quality of white display can be adjusted.

Further, the common electrode layer 204 is formed over the second substrate 201 and the alignment film 208 is formed over the common electrode layer 204.

The liquid crystal layer 205 is formed using a guest-host liquid crystal including a nematic liquid crystal molecule 206 that is a host molecule and a dichroic pigment 207 that is a guest molecule.

Note that the liquid crystal layer 205 can be referred to as a reflective guest-host liquid crystal because the pixel electrode layer 203 has a reflective property and the liquid crystal layer 205 is a guest-host liquid crystal.

As a method for forming the liquid crystal layer 205, a dispenser method (dripping method) or an injection method in which after attachment of the first substrate 200 and the second substrate 201, liquid crystal is injected with the use of capillary phenomenon can be used.

Here, operation in this reflective guest-host liquid crystal is described. In the state where voltage is not applied, the nematic liquid crystal molecule 206 is arranged horizontally, and similarly the dichroic pigment 207 is arranged horizontally. Light incident from the second substrate 201 side enters the liquid crystal layer 205, a component of the incident light having a vibrating surface parallel to the long axis direction of the molecule of the dichroic pigment 207 is absorbed by the dichroic pigment 207, so that black is displayed. On the other hand, when voltage is applied, the nematic liquid crystal molecule 206 is arranged vertically in the electric field direction, and similarly the dichroic pigment 207 is arranged vertically. The light incident from the second substrate 201 side is not absorbed by the dichroic pigment 207, so that it passes through the liquid crystal layer 205 and is reflected by the pixel electrode layer 203. Then, the reflected light passes through the liquid crystal layer 205 again.

When white is displayed, since the pixel electrode layer 203 has a reflective property, incident light is reflected to the liquid crystal layer 205 side by the pixel electrode layer 203. Further, the pixel electrode layer 203 is formed along the first unevenness 210 and the second unevenness 211 of the insulating layer 202, and light incident on the pixel electrode layer 203 can be reflected to the liquid crystal layer 205 side in various directions. Thus, white can be favorably displayed.

Note that a cell gap, which is a thickness of the liquid crystal layer 205, is greater than or equal to 5 µm and less than or equal to 30 µm (preferably greater than or equal to 10 µm and less than or equal to 20 µm). In this specification and the like, the thickness of a cell gap refers to the maximum thickness (film thickness) of a liquid crystal layer.

The insulating layer 202 provided below the pixel electrode layer 203 can be formed using an organic material. Typically, a visible light curable resin, an ultraviolet curable resin, or a thermosetting resin is preferably used. For example, an acrylic resin, an epoxy resin, an amine resin, or the like can be used. Note that the insulating layer 202 may have a stacked-layer structure of plural thin films.

In addition, the micron-sized unevenness (the first unevenness 210) on the insulating layer 202 provided below the pixel electrode layer 203 can have a conical or pyramidal shape with a flat top surface and a trapezoidal cross section, a conical or pyramidal shape with a rounded dome top surface, or the like. In this specification, since the pixel electrode layer 203 is formed so as to cover the top surface and the side surfaces of the first unevenness 210, it is preferable that the first unevenness 210 have a curved surface so as to be favorably covered with the pixel electrode layer 203. In addition, the thickness of the insulating layer 202 provided below the pixel electrode layer 203 is greater than or equal to 0.1 µm and less than or equal to 20 µm.

There is no particular limitation on the method for forming the insulating layer 202, and a dry process such as an evaporation method, a sputtering method, or a plasma CVD method or a wet process such as spin coating, dip coating, spray coating, a droplet discharging method (ink jetting), nanoimprinting, or various printing methods (screen printing or offset printing) may be used depending on the material. As needed, an etching method (dry etching or wet etching) may be employed to form a desired pattern. The insulating layer 202 can be formed, for example, by performing a photolithography step on a photosensitive organic resin, and the first unevenness 210 can be formed.

Note that the second unevenness 211 over the insulating layer 202 can be formed by plasma treatment after the first unevenness 210 is formed. The height of the second unevenness is preferably greater than or equal to 0.1 µm and less than or equal to 1 µm.

Further, as a formation method of the second unevenness 211 over the insulating layer 202, plasma treatment using a dry etching apparatus can be used.

Here, a formation method of the second unevenness 211 over the insulating layer 202 is described with reference to FIGS. 2A and 2B.

Figure 2A:
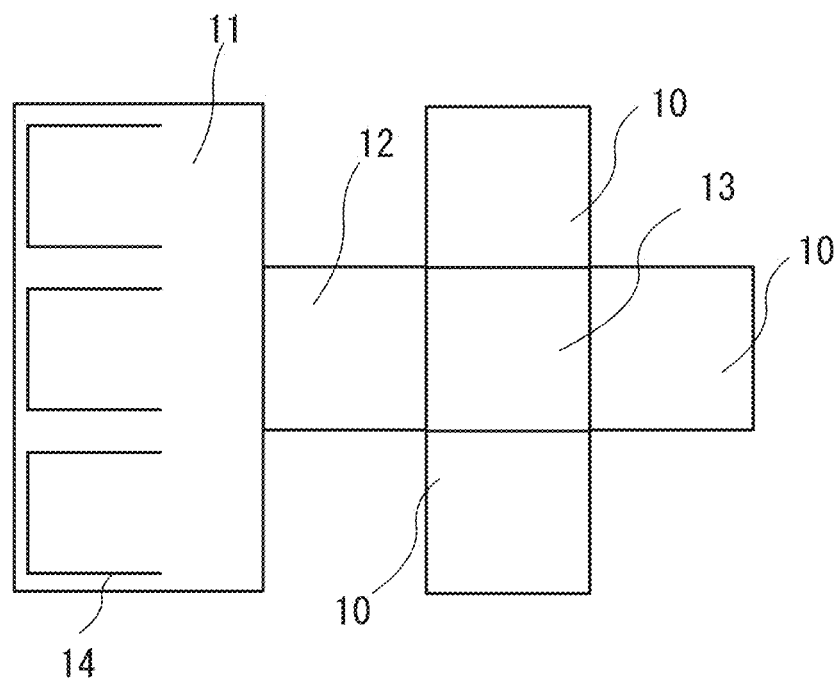
FIG. 2A is a diagram showing one embodiment of multi-chamber equipment and FIG. 2B is a diagram showing one embodiment of a plasma apparatus.

FIG. 2A shows an example of a top view of a single wafer multi-chamber equipment. FIG. 2B is an example of a cross-sectional view of a plasma apparatus (also referred to as a dry etching apparatus or an ashing apparatus) for forming the second unevenness.

Figure 2B:
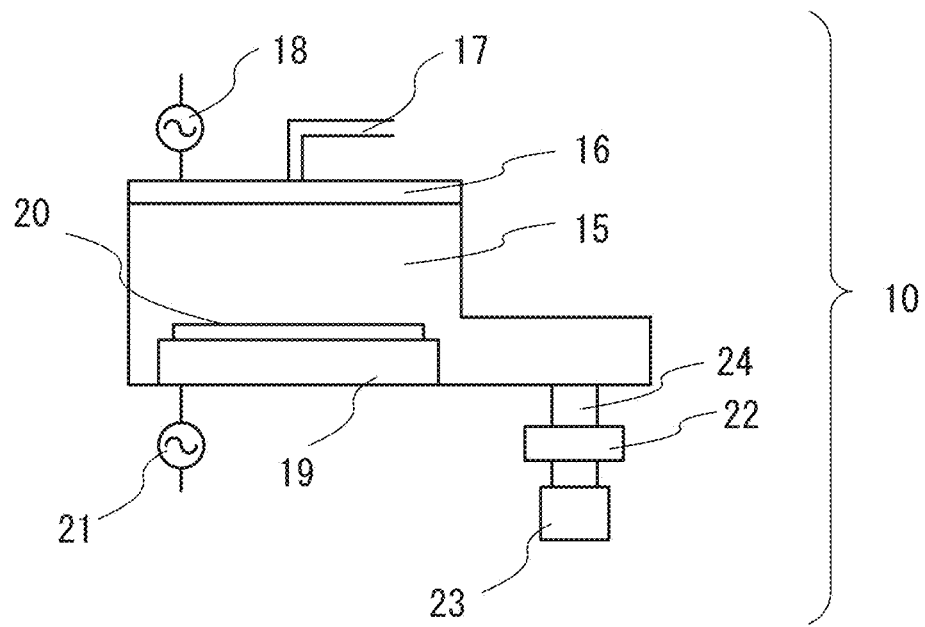

The single wafer multi-chamber equipment shown in FIG. 2A includes three plasma apparatuses 10 each of which is shown in FIG. 2B, a substrate supply chamber 11 including three cassette ports 14 for holding a process substrate, a load lock chamber 12, a transfer chamber 13, and the like. A substrate supplied to the substrate supply chamber 11 is transferred through the load lock chamber 12 and the transfer chamber 13 to a vacuum chamber 15 in the plasma apparatus 10 and is subjected to plasma treatment. The substrate that has been subjected to plasma treatment is transferred from the plasma apparatus 10, through the load lock chamber 12 and the transfer chamber 13, to the substrate supply chamber 11. Note that a transfer robot for transferring a process substrate is provided in each of the substrate supply chamber 11 and the transfer chamber 13.

Referring to FIG. 2B, the plasma apparatus 10 includes the vacuum chamber 15. A plurality of gas outlets (not shown) and an ICP coil 16 (an inductively coupled plasma coil) that is a generation source of plasma are provided on a top portion of the vacuum chamber 15.

The gas outlets are arranged in a radial pattern, seen from the top of the plasma apparatus 10. Each of the gas outlets is connected to a gas supply source for supplying a gas, through a gas flow path 17. The gas supply source includes a mass flow controller and the like and can supply an oxygen gas to the gas flow path 17 at a desired flow rate (greater than 0 sccm and less than or equal to 5000 sccm). The oxygen gas supplied from the gas supply source is supplied from the gate flow path 17, through the gas outlets, into the vacuum chamber 15.

The ICP coil 16 includes a plurality of strip-like conductors each of which has a spiral form. One end of each of the conductors is electrically connected to a first high-frequency power source 18 (13.56 MHz) through a matching circuit for controlling impedance, and the other end thereof is grounded.

A substrate stage 19 functioning as a bottom electrode is provided in a lower portion of the vacuum chamber 15. By an electrostatic chuck or the like provided for the substrate stage 19, a process substrate 20 is held on the substrate stage 19 so as to be detachable. The substrate stage 19 is provided with a heater as a heating system. The substrate stage 19 is connected to a second high-frequency power source 21 (13.56 MHz) for applying a substrate bias voltage.

In addition, the vacuum chamber 15 is provided with an exhaust port 24 and a pressure control valve 22 (also referred to as a slot valve). The pressure control valve 22 is connected to a dry pump 23. The pressure control valve 22 controls the inside pressure of the vacuum chamber 15. The dry pump 23 reduces the inside pressure of the vacuum chamber 15.

Next, an example in which plasma is generated in the vacuum chamber 15 shown in FIG. 2B, and plasma treatment is performed on an organic resin provided for the process substrate 20.

First, the inside pressure of the vacuum chamber 15 is held at a desired pressure by operating the dry pump 23, and then, the process substrate 20 is installed on the substrate stage 19 in the vacuum chamber 15. Note that the process substrate 20 held on the substrate stage 19 has at least an organic resin. In this embodiment, the inside pressure of the vacuum chamber 15 is held at 40 Pa. Note that the flow rate of the oxygen gas supplied from the gas outlets into the vacuum chamber 15 is set at 1800 sccm.

Next, a high-frequency power is applied from the second high-frequency power source 21, so that plasma is generated. Then, the state in which plasma is generated is kept for a certain period (longer than or equal to 30 seconds and shorter than or equal to 6000 seconds). Note that the high-frequency power applied from the second high-frequency power source 21 is greater than or equal to 100 W and less than or equal to 5000 W. In this embodiment, the high-frequency power is 850 W. At this time, a high-frequency power may be applied from the first high-frequency power source 18 to the ICP coil 16. In this embodiment, the high-frequency power is 0 W, that is, the power is not applied.

In this embodiment, the state in which plasma is generated is kept for 600 seconds and then, the process substrate 20 is transferred from the vacuum chamber 15. Through the above steps, the second unevenness can be formed over the organic resin film provided over the process substrate 20.

Note that the liquid crystal display device is a reflective liquid crystal display device in which images are displayed by reflecting external light in this specification. Thus, at least the second substrate 201, the common electrode layer 204, and the like provided on the viewer side need to transmit light. Accordingly, the substrate, insulating layers, and conductive layers existing in the region through which light passes have light-transmitting properties in the visible wavelength range. On the other hand, the pixel electrode layer 203 having a reflective property is provided on the side opposite from the viewer side that transmits light.

For the pixel electrode layer 203, a reflective conductive material is used. Such a reflective conductive material can be formed by a sputtering method, or the like. For example, the pixel electrode layer 203 can be formed using one or more kinds of materials selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of these metals; and a nitride of these metals.

On the other hand, for the common electrode layer 204, a conductive material having a light-transmitting property is used. For example, the common electrode layer 204 can be formed using indium tin oxide (ITO), indium zinc oxide (IZO) in which zinc oxide (ZnO) is mixed with indium oxide, a conductive material in which silicon oxide ($SiO_2$) is mixed with indium oxide, organic indium, organic tin, indium oxide containing tungsten oxide, indium zinc oxide containing tungsten oxide, indium oxide containing titanium oxide, or indium tin oxide containing titanium oxide.

For the first substrate 200 and the second substrate 201, a glass substrate of barium borosilicate glass, aluminoborosilicate glass, or the like, a quartz substrate, a plastic substrate, or the like can be used.

As described above, in the reflective guest-host liquid crystal display device, the pixel electrode layer 203 having a reflective property is provided along the first unevenness 210 and the second unevenness 211 of the insulating layer 202. The surface of the pixel electrode layer 203 is uneven due to the first unevenness 210 and the second unevenness 211. Thus, a display device including a reflective film having a high reflecting property with stability can be provided.

Further, since a guest-host liquid crystal is used for the liquid crystal layer, light absorption is performed by the dichroic pigment mixed into the liquid crystal layer as a guest molecule, so that a polarizing plate is not required. Since a polarizing plate does not need to be provided, light absorption by a polarizing plate is not performed, whereby a brighter display screen with luminance increased can be realized. Thus, power consumption can be reduced because light use efficiency is high, and cost of a polarizing plate can be eliminated.

This embodiment can be implemented in appropriate combination with the structures described in the other embodiments.

(Embodiment 2)

An example of an active matrix liquid crystal display device employing the invention disclosed in this specification will be described with reference to FIGS. 4A and 4B.

Figure 4A:
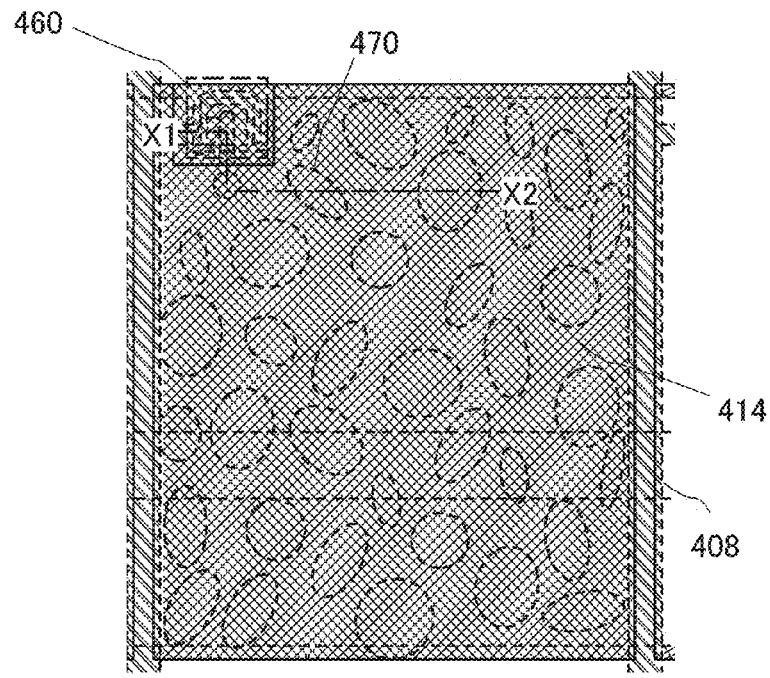
FIGS. 4A and 4B are diagrams showing one embodiment of a liquid crystal display device.

FIG. 4A is a plan view of a liquid crystal display device illustrating one pixel. FIG. 4B is a cross-sectional view taken along line X1-X2 of FIG. 4A.

Figure 4B:
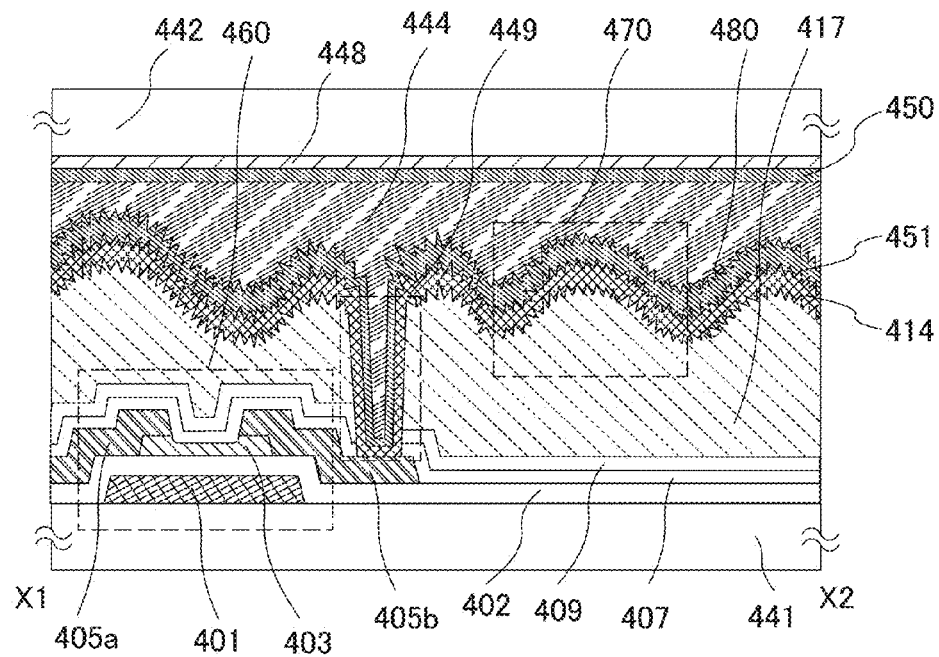

In FIGS. 4A and 4B, a plurality of source wiring layers (including a source electrode layer 405a) is provided in parallel (extends in the vertical direction in the drawing) to be spaced from each other. A plurality of gate wiring layers (including a gate electrode layer 401) are provided to be extended in a direction generally perpendicular to the source wiring layers (the horizontal direction in the drawing) to be spaced from each other. Capacitor wiring layers 408 are adjacent to the plurality of gate wiring layers and extended in a direction generally parallel to the gate wiring layers, that is, a direction generally perpendicular to the source wiring layers (the horizontal direction in the drawing). A generally rectangular space is surrounded by the source wiring layers and the gate wiring layers. In this space, a pixel electrode layer 414 is provided and a common electrode layer 448 is provided with a liquid crystal layer 444 interposed therebetween. A transistor 460 for driving the pixel electrode layer 414 is provided at an upper left corner in FIG. 4A. A plurality of pixel electrode layers 414 and a plurality of transistors 460 are arranged in matrix.

Note that the plan view of FIG. 4A shows the side of the first substrate 441 which is an element substrate, and the liquid crystal layer 444, the common electrode layer 448, the alignment film 450, and the second substrate 442 are omitted in FIG. 4A.

In the liquid crystal display device shown in FIGS. 4A and 4B, the pixel electrode layer 414 that is electrically connected to the transistor 460 functions as a pixel electrode, and the common electrode layer 448 opposite thereto functions as a common electrode. Note that a capacitor is formed by the pixel electrode layer 414 and the capacitor wiring layer 408.

Note that the pixel electrode layer 414 is supplied with a potential of an image signal through the source electrode layer 405a and a drain electrode layer 405b electrically connected to a semiconductor layer 403 of the transistor 460. On the other hand, the common electrode layer 448 is supplied with a fixed potential (e.g., a ground potential) serving as a reference with respect to the potential of the image signal supplied to the pixel electrode layer 414. The common potential is preferably set to a potential around an intermediate potential of an image signal that is transmitted as data in such a level as not to generate flickers. The common electrode layer 448 can operate in a floating state (an electrically isolated state).

FIG. 4B is a liquid crystal display device in which the first substrate 441 on which the transistor 460, the insulating layer 417 having a first unevenness 470 and a second unevenness 480 over the transistor 460, and a pixel electrode layer 414 over the insulating layer 417 are provided, and the second substrate 442 provided with the common electrode layer 448 are provided facing each other with the liquid crystal layer 444 interposed therebetween. Note that an alignment film 451 is formed over the pixel electrode layer 414, and similarly an alignment film 450 is formed on the common electrode layer 448. The insulating layer 417 also functions as an interlayer film of the transistor 460.

The transistor 460 includes the gate electrode layer 401, a gate insulating layer 402, the semiconductor layer 403, the source electrode layer 405a, and the drain electrode layer 405b.

In addition, over the transistor 460, an insulating layer 407, an insulating layer 409, the insulating layer 417, and the pixel electrode layer 414 are formed. In the insulating layer 417, the insulating layer 409, and the insulating layer 407, a contact hole 449 reaching the source electrode layer 405a and the drain electrode layer 405b is formed. Further, the pixel electrode layer 414 is electrically connected to the semiconductor layer 403 through the source electrode layer 405a and the drain electrode layer 405b.

Note that although the nano-sized second unevenness 480 are not shown in the contact hole 449 in FIG. 4B, the nano-sized second unevenness 480 can be formed in the contact hole.

A plurality of the first unevenness 470 and the second unevenness 480 are provided over the insulating layer 417, so that the uneven surface is formed. The pixel electrode layer 414 is formed so as to cover the first unevenness 470 and the second unevenness 480, so that the pixel electrode layer 414 has also an uneven surface. Further, the first unevenness 470 and the second unevenness 480 are provided to project into the liquid crystal layer 444. The first unevenness 470 is formed irregularly to have an ellipsoidal shape in the plan view as shown in FIG. 4A. Note that in this specification, "unevenness" includes a structure body including at least two different projecting portions and a depressed portion between the structure bodies each including different projecting portions. "Height of the unevenness" means a distance between the highest portion of the projecting portion and the lowest portion of the depressed portion. "Size of the unevenness" means a distance between the highest portions of the different projecting portions included in the structure body in a cross section of the structure body including different projecting portions and the highest portions thereof.

Note that there is no particular limitation on the shape of the first unevenness 470, and the first unevenness 470 may be formed in any of an oval shape, a square shape, a rectangular shape, or the like.

There is no particular limitation on the formation method of the insulating layer 417, and the following method can be employed depending on the material: spin coating, dip coating, spray coating, or a droplet discharging method (e.g., ink jetting, screen printing, or offset printing), roll coating, curtain coating, knife coating, or the like.

The first substrate 441 and the second substrate 442 can be fixed to each other with a sealant (not shown) with the liquid crystal layer 444 interposed therebetween.

As the sealant, it is typically preferable to use a visible light curable resin, an ultraviolet curable resin, or a thermosetting resin. Typically, an acrylic resin, an epoxy resin, an amine resin, or the like can be used. Further, a photopolymerization initiator (typically, an ultraviolet light polymerization initiator), a thermosetting agent, a filler, or a coupling agent may be included in the sealant.

As the liquid crystal layer 444, a guest-host liquid crystal including a nematic liquid crystal molecule that is a host molecule and a dichroic pigment that is a guest molecule is used. The liquid crystal layer 444 can be formed using a material and a method similar to those of the liquid crystal layer 205 described in Embodiment 1.

In addition, in the liquid crystal layer 444, in the case where voltage is not applied between the pixel electrode layer 414 and the common electrode layer 448 (the case also referred to as an off state), the nematic liquid crystal molecule and the dichroic pigment dispersed in the guest-host liquid crystal are arranged horizontally, so that incident light is absorbed into the liquid crystal layer 444. Thus, black display is seen from the viewer side.

On the other hand, in the case where voltage is applied between the pixel electrode layer 414 and the common electrode layer 448 (the case also referred to as an on state), an electric field is formed in the liquid crystal layer 444, so that the nematic liquid crystal molecule and the dichroic pigment are arranged in an electric field direction, and incident light is not absorbed by the nematic liquid crystal molecule and the dichroic pigment and passes through the liquid crystal layer 444. Consequently, the liquid crystal layer 444 is in a light-transmitting state and a transparent state. When the liquid crystal layer 444 gets into a light-transmitting state, display seen from the viewer side depends on materials provided over and below the liquid crystal layer 444.

Since the pixel electrode layer 414 has a reflective property, incident light is reflected to the liquid crystal layer 444 side. Since the pixel electrode layer 414 is formed along the first unevenness 470 and the second unevenness 480 over the insulating layer 417, light incident on the pixel electrode layer 414 can be reflected to the liquid crystal layer 444 side in various directions. Thus, white can be favorably displayed.

Here, a manufacturing method of the transistor 460 will be described below.

First, a gate electrode layer 401 is formed over the first substrate 441.

An insulating film functioning as a base film may be provided between the first substrate 441 and the gate electrode layer 401. The base film has a function of preventing diffusion of an impurity element from the first substrate 441, and can be formed with a single-layer structure or a stacked-layer structure using one or more of a silicon nitride film, a silicon oxide film, a silicon nitride oxide film, and a silicon oxynitride film.

The gate electrode layer 401 can be formed with a single-layer structure or a stacked-layer structure using any of a metal material such as molybdenum, titanium, tantalum, tungsten, aluminum, copper, neodymium, or scandium, or an alloy material that contains any of these materials as its main component.

For example, as a two-layer structure of the gate electrode layer 401, the following two-layer structures are preferable: a two-layer structure of an aluminum layer and a molybdenum layer thereover, a two-layer structure of a copper layer and a molybdenum layer thereover, a two-layer structure of a copper layer and a titanium nitride layer or a tantalum nitride layer thereover, and a two-layer structure of a titanium nitride layer and a molybdenum layer. As a three-layer structure, a stack of a tungsten layer or a tungsten nitride layer, an alloy layer of aluminum and silicon or an alloy layer of aluminum and titanium, and a titanium nitride layer or a titanium layer is preferable.

Next, the gate insulating layer 402 is formed over the gate electrode layer 401.

The gate insulating layer 402 can be formed with a single-layer structure or a stacked-layer structure using any of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer by a plasma CVD method, a sputtering method, or the like. Alternatively, the gate insulating layer 402 can be formed using a silicon oxide layer by a CVD method in which an organosilane gas is used. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

Note that in the formation process of the semiconductor layer, the electrode layer, and the wiring layer, each layer is patterned by use of a resist mask having regions with different thicknesses (typically, two different thicknesses) which is formed using a multi-tone mask, so that the number of resist masks can be reduced, resulting in simplified process and lower cost. In addition, an etching is performed to process each thin film of each of the layers into a desired shape. Dry etching or wet etching can be used for the etching step.

As an etching apparatus used for the dry etching, an etching apparatus using a reactive ion etching method (an RIE method), or a dry etching apparatus using a high-density plasma source such as electron cyclotron resonance (ECR) or inductively coupled plasma (ICP) can be used.

When a dry etching is performed, the etching conditions (the amount of electric power applied to a coil-shaped electrode, the amount of electric power applied to an electrode on a substrate side, the temperature of the electrode on the substrate side, and the like) are adjusted as appropriate so that the films can be etched into desired shapes.

When a wet etching is performed, the etching conditions (an etchant, etching time, temperature, and the like) are adjusted as appropriate depending on the material so that the films can be etched into a desired shape.

Next, the semiconductor layer 403 is formed over the gate insulating layer 402. For the semiconductor layer 403, an oxide semiconductor layer can be used.

Next, the source electrode layer 405a and the drain electrode layer 405b are formed over the semiconductor layer 403 and the gate insulating layer 402.

As a material of the source electrode layer 405a and the drain electrode layer 405b, an element selected from Al, Cr, Ta, Ti, Mo, and W, an alloy containing any of these elements as a component, an alloy film containing any of these elements in combination, and the like can be given. Further, in the case where heat treatment is performed, the conductive film preferably has heat resistance against the heat treatment. For example, since the use of Al alone brings disadvantages such as low heat resistance and a tendency to corrosion, aluminum is used in combination with a conductive material having heat resistance. As the conductive material having heat resistance which is combined with Al, an element selected from titanium (Ti), tantalum (Ta), tungsten (W), molybdenum (Mo), chromium (Cr), neodymium (Nd), and scandium (Sc), an alloy containing any of these elements as a component, an alloy film containing any of these elements in combination, or a nitride containing any of these elements as a component is used.

Note that the semiconductor layer 403 of the transistor 460 is an example of a semiconductor layer partly etched and has a groove (a depressed portion).

Next, the insulating layer 407 and the insulating layer 409 are formed over the gate insulating layer 402, the semiconductor layer 403, the source electrode layer 405a, and the drain electrode layer 405b.

For the insulating layer 407 and the insulating layer 409, an organic insulating film or an inorganic insulating film formed by a dry process or a wet process can be used. For example, a silicon nitride film, a silicon oxide film, a silicon oxynitride film, an aluminum oxide film, or a tantalum oxide film, which is formed by a plasma CVD method, a sputtering method, or the like, can be used. Alternatively, an organic material such as polyimide, acrylic, benzocyclobutene, polyamide, or epoxy can be used. Other than such organic materials, a low-dielectric constant material (a low-k material) or a siloxane-based resin can be used.

Note that the siloxane-based resin corresponds to a resin including a Si—O—Si bond formed using a siloxane-based material as a starting material. The siloxane-based resin may include, as a substituent, an organic group (e.g., an alkyl group or an aryl group) or a fluoro group. In addition, the organic group may include a fluoro group. A siloxane-based resin is applied by a coating method and baked; then, the insulating layer 407 can be formed.

Note that the insulating layer 407 and the insulating layer 409 may be formed by stacking plural insulating films formed using any of these materials. For example, the insulating layer 407 may have such a structure that an organic resin film is stacked over an inorganic insulating film.

Through the above steps, the transistor 460 can be formed over the first substrate 441.

Next, the insulating layer 417 is formed over the transistor 460. The first unevenness 470 and the second unevenness 480 are provided over the insulating layer 417. The insulating layer 417, the first unevenness and the second unevenness can be formed using a material and a method similar to those of the insulating layer 202, the first unevenness 210, and the second unevenness 211 described in Embodiment 1, respectively.

Next, the pixel electrode layer 414 is formed along the first unevenness 470 and the second unevenness 480. The pixel electrode layer 414 can be formed using a reflective conductive material and using a material and a method similar to those of the pixel electrode layer 203 described in Embodiment 1.

As described above, the insulating layer 417 having the first unevenness 470 and the second unevenness 480 is formed over the first substrate 441 including the transistor 460. Since the pixel electrode layer 414 is formed along the first unevenness 470 and the second unevenness 480, light incident on the pixel electrode layer 414 can be reflected to the liquid crystal layer 444 side in various directions.

In the reflective guest-host liquid crystal described in this embodiment, incident light is not polarized, so that a polarizing plate is not necessarily provided.

The liquid crystal display device using the reflective guest-host liquid crystal is not provided with a polarizing plate, so that light absorption by a polarizing plate is not performed, whereby the display screen can increase in brightness. Thus, power consumption can be reduced because light use efficiency is high. Further, the number of manufacturing steps and cost of a polarizing plate can be eliminated, so that higher throughput and lower cost can be realized. Accordingly, it is further effective to use a guest-host liquid crystal material for a display device.

This embodiment can be implemented in appropriate combination with the structures described in the other embodiments.

(Embodiment 3)

In this embodiment, an example of a transistor that can be applied to a liquid crystal display device disclosed in this specification will be described. There is no particular limitation on a structure of a transistor that can be applied to a liquid crystal display device disclosed in this specification. For example, a staggered type or planar type transistor having a top-gate structure or a bottom-gate structure can be employed. The transistor may have a single-gate structure including one channel formation region, a double-gate structure including two channel formation regions, or a triple-gate structure including three channel formation regions. Alternatively, the transistor may have a dual-gate structure including two gate electrode layers positioned over and below a channel region with a gate insulating layer provided therebetween. FIGS. 6A to 6D illustrate examples of cross-sectional structures of transistors.

Figure 6A:
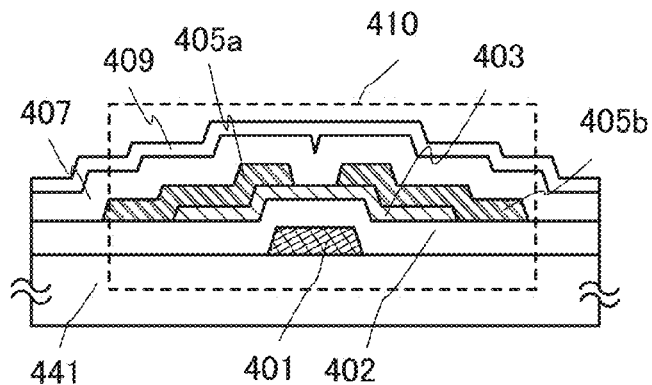
FIGS. 6A to 6D are diagrams each showing one embodiment of a transistor which can be applied to the liquid crystal display device.

A transistor 410 illustrated in FIG. 6A is one of bottom gate thin film transistors and is also called an inverted staggered thin film transistor.

The transistor 410 includes, over a substrate 441 having an insulating surface, a gate electrode layer 401, a gate insulating layer 402, a semiconductor layer 403, a source electrode layer 405a, and a drain electrode layer 405b. An insulating layer 407 covering the transistor 410 is stacked over the semiconductor layer 403. An insulating layer 409 is formed over the insulating layer 407.

Figure 6B:
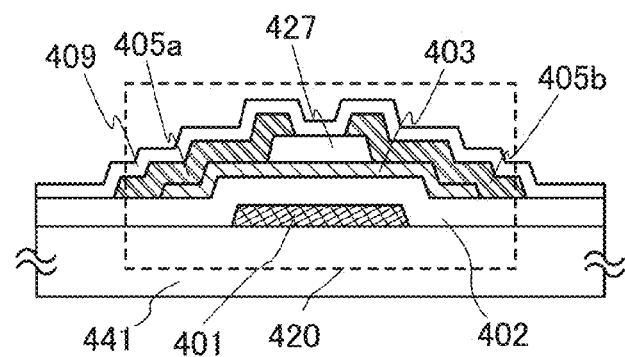

A transistor 420 illustrated in FIG. 6B is one of bottom-gate transistors called channel-protective (channel-stop) transistors and is also called an inverted staggered transistor.

The transistor 420 includes, over the substrate 441 having an insulating surface, the gate electrode layer 401, the gate insulating layer 402, the semiconductor layer 403, an insulating layer 427 functioning as a channel protective layer which covers a channel formation region of the semiconductor layer 403, the source electrode layer 405a, and the drain electrode layer 405b. The insulating layer 409 is formed so as to cover the transistor 420.

Figure 6C:
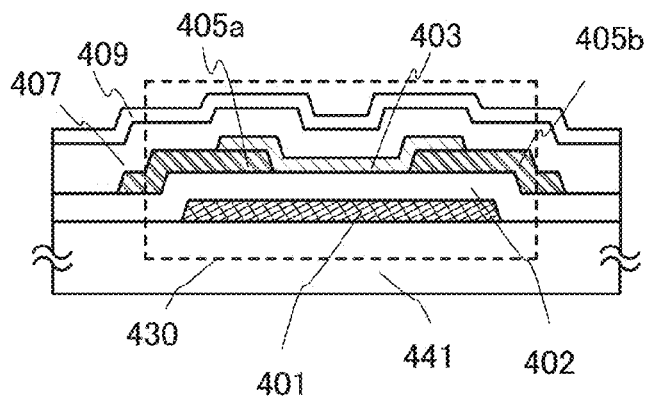

A transistor 430 illustrated in FIG. 6C is a bottom-gate thin film transistor and includes, over the substrate 441 having an insulating surface, the gate electrode layer 401, the gate insulating layer 402, the source electrode layer 405a, the drain electrode layer 405b, and the semiconductor layer 403. In addition, the insulating layer 407 covering the transistor 430 is provided in contact with the semiconductor layer 403. The insulating layer 409 is formed over the insulating layer 407.

In the transistor 430, the gate insulating layer 402 is provided on and in contact with the substrate 441 and the gate electrode layer 401, and the source electrode layer 405a and the drain electrode layer 405b are provided on and in contact with the gate insulating layer 402. Further, the semiconductor layer 403 is provided over the gate insulating layer 402, the source electrode layer 405a, and the drain electrode layer 405b.

Figure 6D:
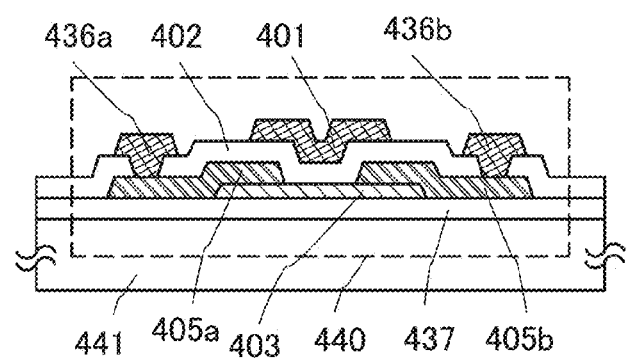

A transistor 440 illustrated in FIG. 6D is one of top-gate thin film transistors. The transistor 440 includes, over the substrate 441 having an insulating surface, an insulating layer 437, the semiconductor layer 403, the source electrode layer 405a, the drain electrode layer 405b, the gate insulating layer 402, and the gate electrode layer 401. A wiring layer 436a and a wiring layer 436b are provided to be in contact with and electrically connected to the source electrode layer 405a and the drain electrode layer 405b, respectively.

Although there is no particular limitation on a substrate used for the substrate 441 having an insulating surface, a glass substrate of barium borosilicate glass, aluminoborosilicate glass, or the like can be used.

In the bottom-gate transistors 410, 420, and 430, an insulating film serving as a base film may be provided between the substrate 441 and the gate electrode layer 401. The base film functions to prevent diffusion of an impurity element from the substrate 441 and can be formed using one film or stacked films selected from a silicon nitride film, a silicon oxide film, a silicon nitride oxide film, and a silicon oxynitride film.

The gate electrode layer 401 can be formed to have a single-layer or stacked-layer structure using a metal material such as molybdenum, titanium, chromium, tantalum, tungsten, aluminum, copper, neodymium, or scandium, or an alloy material which contains any of these materials as its main component.

The gate insulating layer 402 can be formed to have a single-layer or stacked-layer structure using any of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a gallium oxide layer, and a hafnium oxide layer by a plasma CVD method, a sputtering method, or the like. For example, by a plasma CVD method, a silicon nitride layer ($SiN_y$ (y>0)) with a thickness of greater than or equal to 50 nm and less than or equal to 200 nm is formed as a first gate insulating layer, and a silicon oxide layer ($SiO_x$ (x>0)) with a thickness of greater than or equal to 5 nm and less than or equal to 300 nm is formed as a second gate insulating layer over the first gate insulating layer, so that a gate insulating layer with a total thickness of less than or equal to 500 nm is formed.

A conductive film used for the source electrode layer 405a and the drain electrode layer 405b can be formed using an element selected from Al, Cr, Cu, Ta, Ti, Mo, and W, an alloy including any of these elements as a component, an alloy film including a combination of any of these elements, or the like. The conductive film may have a structure in which a high-melting-point metal layer of Ti, Mo, W, or the like is stacked over and/or below a metal layer of Al, Cu, or the like. When an Al material to which an element (e.g., Si, Nd, or Sc) which prevents generation of hillocks and whiskers in an Al film is added is used, heat resistance can be increased.

A material similar to that of the source electrode layer 405a and the drain electrode layer 405b can be used for a conductive film such as the wiring layer 436a and the wiring layer 436b which are connected to the source electrode layer 405a and the drain electrode layer 405b, respectively.

Alternatively, the conductive film used for the source electrode layer 405a and the drain electrode layer 405b (including a wiring layer formed using the same layer as the source electrode layer 405a and the drain electrode layer 405b) may be formed using a conductive metal oxide. As conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$—ZnO), or any of these metal oxide materials containing a silicon oxide can be used.

For the insulating layer 407, typically, an inorganic insulating film such as a silicon oxide film, a silicon oxynitride film, an aluminum oxide film, or an aluminum oxynitride film can be used.

For the insulating layer 409, an inorganic insulating film such as a silicon nitride film, an aluminum nitride film, a silicon nitride oxide film, or an aluminum nitride oxide film can be used.

In addition, a planarization insulating film may be formed over the insulating layer 409 in order to reduce surface unevenness due to the transistor. For the planarization insulating film, an organic material such as polyimide, acrylic, or benzocyclobutene can be used. Other than such organic materials, a low-dielectric constant material (a low-k material) or the like can be used. Note that the planarization insulating film may be formed by stacking a plurality of insulating films formed from these materials.

This embodiment can be implemented in appropriate combination with the structures described in the other embodiments.

(Embodiment 4)

An oxide semiconductor will be described as a material that can be used for the semiconductor layers of the transistors in Embodiment 2 or 3.

In the transistor 460 described in Embodiment 2 or the transistors 410, 420, 430, and 440 illustrated in FIGS. 6A to 6D in Embodiment 3, an oxide semiconductor can be used as the semiconductor layer 403.

As an oxide semiconductor used for the semiconductor layer 403, an In—Sn—Ga—Zn—O-based oxide semiconductor layer which is a four-component metal oxide; an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, or a Sn—Al—Zn—O-based oxide semiconductor layer which are three-component metal oxides; an In—Ga—O-based oxide semiconductor layer, an In—Zn—O-based oxide semiconductor layer, a Sn—Zn—O-based oxide semiconductor layer, an Al—Zn—O-based oxide semiconductor layer, a Zn—Mg—O-based oxide semiconductor layer, a Sn—Mg—O-based oxide semiconductor layer, or an In—Mg—O-based oxide semiconductor layer which are two-component metal oxides; or an In—O-based oxide semiconductor layer, a Sn—O-based oxide semiconductor layer, or a Zn—O-based oxide semiconductor layer can be used. Further, $SiO_2$ may be contained in the above oxide semiconductor. Here, for example, the In—Ga—Zn—O-based oxide semiconductor means an oxide containing at least In, Ga, and Zn, and the composition ratio of the elements is not particularly limited. The In—Ga—Zn—O-based oxide semiconductor may contain an element other than In, Ga, and Zn.

For the oxide semiconductor layer, a thin film expressed by a chemical formula of $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

In the case where an In—Zn—O-based material is used as the oxide semiconductor, a target to be used has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor that has an atomic ratio of In:Zn:O=X:Y:Z, the relation of Z>1.5X+Y is satisfied.

In the transistors 410, 420, 430, 440, and 460 each including the oxide semiconductor layer, the current value in an off state (off-state current value) can be reduced.

In addition, the transistors 410, 420, 430, 440, and 460 each using the oxide semiconductor layer as the semiconductor layer 403 can operate at high speed because relatively high field-effect mobility can be obtained. Accordingly, by using the transistor in a pixel portion of a liquid crystal display device, a high-quality image can be provided. Since the transistors can be separately formed over one substrate in a driver circuit portion and a pixel portion, the number of components can be reduced in the liquid crystal display device.

This embodiment can be implemented in appropriate combination with the structures described in the other embodiments.

(Embodiment 5)

In this embodiment, another example of the transistor including an oxide semiconductor layer, and a manufacturing method thereof will be described in detail with reference to FIGS. 7A to 7E. The same portion as or a portion having a function similar to those in the above embodiments can be formed in steps similar to those in the above embodiments, and repetitive description is omitted. Detailed description of the same portions is also omitted.

FIGS. 7A to 7E illustrate an example of the cross-sectional structure of a transistor. A transistor 510 illustrated in FIGS. 7A to 7E is a bottom-gate inverted staggered thin film transistor which is similar to the transistor 410 illustrated in FIG. 6A.

An oxide semiconductor used for a semiconductor layer in this embodiment is an i-type (intrinsic) or substantially i-type (intrinsic) oxide semiconductor. The i-type (intrinsic) or substantially i-type (intrinsic) oxide semiconductor is obtained in such a manner that hydrogen, which is an n-type impurity, is removed from an oxide semiconductor and then oxygen is supplied thereto. In this manner, the i-type (intrinsic) or substantially i-type (intrinsic) oxide semiconductor is highly purified so as to contain impurities, which are not components of the oxide semiconductor, as little as possible. In other words, a highly-purified i-type (intrinsic) semiconductor or a semiconductor close thereto is obtained by reducing impurities such as hydrogen or water as much as possible and supplying oxygen thereto. This enables the Fermi level ($E_f$) to be at the same level as the intrinsic Fermi level ($E_i$). Thus, the oxide semiconductor layer included in the transistor 510 is an oxide semiconductor layer that is highly purified and made to be electrically i-type (intrinsic).

Further, a highly-purified oxide semiconductor includes extremely few carriers (close to zero), and the carrier concentration thereof is lower than $1\times10^{14}/cm^3$, preferably lower than $1\times10^{12}/cm^3$, and further preferably lower than $1\times10^{11}/cm^3$.

Since the oxide semiconductor includes extremely few carriers, the off-state current that is one of electrical characteristics of transistors can be reduced. It is preferable that the off-state current be as low as possible.

Specifically, the current value in the off state (the off-state current value) of the transistor 510 including the aforementioned oxide semiconductor layer, can be reduced to less than 10 zA/μm per micrometer of channel width, and further to less than 100 zA/μm at 85° C.

The on-state current of the transistor 510 including the aforementioned oxide semiconductor layer hardly depends on temperature and the off-state current remains very low. Further, transistor characteristics hardly change due to light deterioration.

Steps of manufacturing the transistor 510 over a substrate 505 will be described below with reference to FIGS. 7A to 7E.

First, a conductive film is formed over the substrate 505 having an insulating surface; then, a gate electrode layer 511 is formed in a first photolithography step. Note that a resist mask may be formed by an inkjet method. In the case of forming a resist mask by an inkjet method, the manufacturing cost can be reduced because a photomask is not used.

As the substrate 505 having an insulating surface, a substrate similar to the substrate 441 described in Embodiment 3 can be used. In this embodiment, a glass substrate is used as the substrate 505.

An insulating film serving as a base film may be provided between the substrate 505 and the gate electrode layer 511. The base film has a function of preventing diffusion of an impurity element from the substrate 505, and can be formed to have a single-layer structure or a multi-layer structure using one or more films selected from a silicon nitride film, a silicon oxide film, a silicon nitride oxide film, and a silicon oxynitride film.

The gate electrode layer 511 can be formed to have a single-layer structure or a multi-layer structure using a metal material such as molybdenum, titanium, tantalum, tungsten, aluminum, copper, neodymium, or scandium, or an alloy material containing any of these as a main component.

Next, a gate insulating layer 507 is formed over the gate electrode layer 511. The insulating layer 507 can be formed to have a single-layer structure or a stacked-layer structure using a silicon oxide layer, a silicon nitride layer, a silicon oxynitride layer, a silicon nitride oxide layer, a gallium oxide layer, an aluminum oxide layer, an aluminum nitride layer, an aluminum oxynitride layer, an aluminum nitride oxide layer, a hafnium oxide layer, by a plasma CVD method, a sputtering method, or the like. In addition, for the oxide semiconductor in this embodiment, an oxide semiconductor which is made to be an i-type or substantially i-type by removing impurities and supplying oxygen thereto is used. Since such a highly-purified oxide semiconductor is highly sensitive to an interface level and interface charge, an interface between the oxide semiconductor layer and the gate insulating layer is important. For that reason, the gate insulating layer in contact with a highly-purified oxide semiconductor needs to have high quality.

For example, a high-density plasma CVD method using microwaves (with a frequency of 2.45 GHz, for example) is preferably employed because a dense insulating layer having high withstand voltage and high quality can be formed. When a highly-purified oxide semiconductor and a high-quality gate insulating layer are in close contact with each other, the interface level can be reduced and good interface characteristics can be obtained.

It is needless to say that another film formation method such as a sputtering method or a plasma CVD method can be employed as long as a high-quality insulating layer can be formed as a gate insulating layer. Moreover, it is possible to form an insulating layer whose quality and characteristics of an interface with an oxide semiconductor are improved through heat treatment performed after the formation of the insulating layer. In any case, an insulating layer needs to have not only favorable quality as the gate insulating layer, but also lower interface state density with an oxide semiconductor to form a favorable interface.

Further, in order that hydrogen, hydroxyl groups, and moisture might be contained in the gate insulating layer 507 and an oxide semiconductor layer 530 as little as possible, as pretreatment for formation of the oxide semiconductor layer 530, the substrate 505 over which the gate electrode layer 511 is formed or the substrate 505 over which the gate insulating layer 507 is formed are preferably preheated in a preheating chamber of a sputtering apparatus, so that impurities such as hydrogen and moisture adsorbed to the substrate 505 are eliminated and evacuation is performed. Note that a cryopump is preferably provided as an evacuation unit in the preheating chamber. This preheating treatment may be omitted. This preheating step may also be performed on the substrate 505 over which a source electrode layer 515a and a drain electrode layer 515b are formed before formation of an insulating layer 516.

Figure 7A:
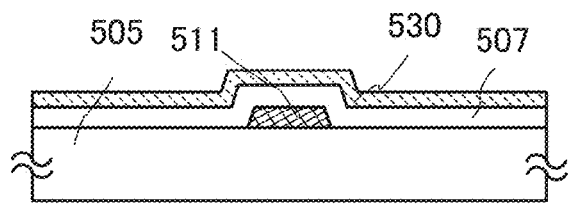
FIGS. 7A to 7E are diagrams showing one embodiment of a transistor which can be applied to the liquid crystal display device and a manufacturing method thereof.
Figure 7B:
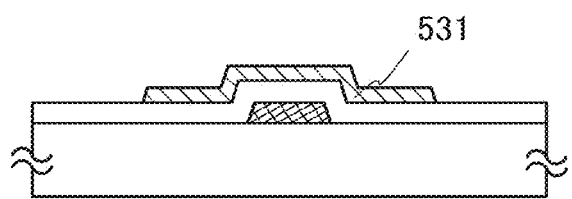

Next, the oxide semiconductor layer 530 having a thickness of 2 nm to 200 nm inclusive, preferably 5 nm to 30 nm inclusive is formed over the gate insulating layer 507 (see FIG. 7A).

Note that before the oxide semiconductor layer 530 is formed by a sputtering method, powdery substances (also referred to as particles or dust) attached to a surface of the gate insulating layer 507 are preferably removed by reverse sputtering in which plasma is generated by introduction of an argon gas. The reverse sputtering refers to a method in which voltage is applied using an RF power source to a substrate side in an argon atmosphere and a substrate surface is exposed to plasma so that the surface is modified. Note that instead of an argon atmosphere, a nitrogen atmosphere, a helium atmosphere, an oxygen atmosphere, or the like may be used.

For the oxide semiconductor layer 530, it is possible to use the oxide semiconductor described in Embodiment 3, such as a four-component metal oxide, a three-component metal oxide, a two-component metal oxide, an In—O-based oxide semiconductor, a Sn—O-based oxide semiconductor, or a Zn—O-based oxide semiconductor. Further, $SiO_2$ may be contained in the above oxide semiconductor. In this embodiment, the oxide semiconductor layer 530 is formed by a sputtering method with the use of an In—Ga—Zn—O-based oxide semiconductor target. A cross-sectional view in this step is illustrated in FIG. 7A. Alternatively, the oxide semiconductor layer 530 can be formed by a sputtering method in a rare gas (typically argon) atmosphere, an oxygen atmosphere, or a mixed atmosphere containing a rare gas and oxygen.

As a target for forming the oxide semiconductor layer 530 by a sputtering method, for example, a target with a composition ratio of $In_2O_3:Ga_2O_3:ZnO=1:1:1$ [molar ratio] (i.e., In:Ga:Zn=1:1:0.5 [atomic ratio]), can be used. Alternatively, a target having a composition ratio of In:Ga:Zn=1:1:1 [atomic ratio] or a composition ratio of In:Ga:Zn=1:1:2 [atomic ratio] may be used. The filling rate of the oxide target is greater than or equal to 90% and less than or equal to 100%, preferably greater than or equal to 95% and less than or equal to 99.9%. With the use of a metal oxide target with a high filling rate, an oxide semiconductor layer having high density can be obtained.

A high-purity gas from which impurities such as hydrogen, water, hydroxyl groups, or hydride have been removed is preferably used as a sputtering gas for forming the oxide semiconductor layer 530.

The substrate is held in a deposition chamber kept under reduced pressure, and the substrate temperature is set to higher than or equal to 100° C. and lower than or equal to 600° C., preferably higher than or equal to 200° C. and lower than or equal to 400° C. By forming the oxide semiconductor layer while heating the substrate, the concentration of impurities included in the formed oxide semiconductor layer can be reduced. In addition, damage due to sputtering can be reduced. Then, a sputtering gas from which hydrogen and moisture have been removed is introduced into the deposition chamber while moisture remaining therein is removed, and the oxide semiconductor layer 530 is formed over the substrate 505 with the use of the above target. In order to remove moisture remaining in the deposition chamber, an entrapment vacuum pump such as a cryopump, an ion pump, or a titanium sublimation pump is preferably used. The evacuation unit may be a turbo molecular pump provided with a cold trap. In the deposition chamber which is evacuated with the cryopump, a hydrogen atom, a compound containing a hydrogen atom, such as water ($H_2O$), (more preferably, also a compound containing a carbon atom), and the like are removed, whereby the concentration of an impurity in the oxide semiconductor layer formed in the deposition chamber can be reduced.

An example of the deposition conditions is as follows: the distance between the substrate and the target is 100 mm, the pressure is 0.6 Pa, the direct-current (DC) power source is 5 kW, and the atmosphere is 50 sccm of argon and 50 sccm of oxygen (the proportion of the oxygen flow rate is 50%). Note that a pulsed direct-current power source is preferably used, in which case powdery substances (also referred to as particles or dust) generated in deposition can be reduced and the film thickness can be uniform.

Next, the oxide semiconductor layer 530 is processed into an island-shaped oxide semiconductor layer in a second photolithography step. A resist mask for forming the island-shaped oxide semiconductor layer may be formed by an inkjet method. In the case of forming a resist mask by an inkjet method, the manufacturing cost can be reduced because a photomask is not used.

In the case where a contact hole is formed in the gate insulating layer 507, the step of forming the contact hole can be performed at the same time as the processing of the oxide semiconductor layer 530.

Note that the oxide semiconductor layer 530 may be etched dry etching or wet etching, or both dry etching and wet etching. As an etchant used for wet etching of the oxide semiconductor layer 530, for example, a mixed solution of phosphoric acid, acetic acid, and nitric acid, an ammonia hydrogen peroxide mixture (hydrogen peroxide water at 31 wt %: ammonia water at 28 wt %: water=5:2:2) can be used. Alternatively, ITO07N (produced by KANTO CHEMICAL CO., INC.) may be used.

Next, the oxide semiconductor layer is subjected to first heat treatment, so that the oxide semiconductor layer can be dehydrated or dehydrogenated. The temperature of the first heat treatment is higher than or equal to 400° C. and lower than or equal to 750° C., preferably higher than or equal to 400° C. and lower than the strain point of the substrate. Here, the substrate is put in an electric furnace which is a kind of heat treatment apparatus and heat treatment is performed on the oxide semiconductor layer at 450° C. for one hour in a nitrogen atmosphere, and then, the oxide semiconductor layer is not exposed to the air so that entry of water and hydrogen into the oxide semiconductor layer is prevented; thus, an oxide semiconductor layer 531 is obtained (see FIG. 7B).

Note that a heat treatment apparatus is not limited to an electrical furnace, and a device for heating an object to be processed by heat conduction or heat radiation from a heating element such as a resistance-heating element, may be used. For example, an RTA (rapid thermal anneal) apparatus such as a GRTA (gas rapid thermal anneal) apparatus or an LRTA (lamp rapid thermal anneal) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. The GRTA apparatus is an apparatus for heat treatment using a high-temperature gas. As the high-temperature gas, an inert gas that does not react with an object to be processed by heat treatment, like nitrogen or a rare gas such as argon is used.

For example, as the first heat treatment, GRTA may be performed in which the substrate is moved into an inert gas heated to a temperature as high as 650° C. to 700° C., heated for several minutes, and moved out of the inert gas heated to the high temperature.

Note that in the first heat treatment, it is preferable that water, hydrogen, and the like be not contained in the atmosphere of nitrogen or a rare gas such as helium, neon, or argon. It is preferable that the purity of nitrogen or the rare gas such as helium, neon, or argon which is introduced into a heat treatment apparatus be set to higher than or equal to 6N (99.9999%), preferably higher than or equal to 7N (99.99999%) (that is, the impurity concentration is lower than or equal to 1 ppm, preferably lower than or equal to 0.1 ppm).

After the oxide semiconductor layer is heated in the first heat treatment, a high-purity oxygen gas, a high-purity $N_2O$ gas, or ultra-dry air (having a dew point of −40° C. or lower, preferably −60° C. or lower) may be introduced into the furnace. It is preferable that the oxygen gas or the $N_2O$ gas do not include water, hydrogen, and the like. The purity of the oxygen gas or the $N_2O$ gas introduced into the heat treatment apparatus is preferably higher than or equal to 6N, preferably higher than or equal to 7N (i.e., the concentration of an impurity in the oxygen gas or the $N_2O$ gas is lower than or equal to 1 ppm, preferably lower than or equal to 0.1 ppm). Oxygen, which is a main component of an oxide semiconductor and which has been reduced in the step of removing impurities by dehydration or dehydrogenation, is supplied by the action of the oxygen gas or the $N_2O$ gas, so that the oxide semiconductor layer can be a highly-purified and electrically i-type (intrinsic) oxide semiconductor.

The first heat treatment of the oxide semiconductor layer may be performed on the oxide semiconductor layer 530 before being processed into the island-shaped oxide semiconductor layer. In that case, after the first heat treatment, the substrate is taken out from the heat treatment apparatus, and then a photolithography step is performed.

The timing at which the first heat treatment is performed is not limited to the aforementioned one, and the first heat treatment may be performed at the following timing after the oxide semiconductor layer is formed: after a source electrode layer and a drain electrode layer are formed over the oxide semiconductor layer; or after an insulating layer is formed over the source electrode layer and the drain electrode layer.

In the case where a contact hole is formed in the gate insulating layer 507, the step of forming the contact hole may be performed either before or after the oxide semiconductor layer 530 is subjected to the first heat treatment.

Alternatively, an oxide semiconductor layer may be formed through two deposition steps and two heat treatment steps. The thus formed oxide semiconductor layer has a thick crystalline region (a single crystal region), that is, a crystalline region whose c-axis is aligned in a direction perpendicular to a surface of the layer, even when a base component is made of an oxide, a nitride, a metal, or the like. For example, a first oxide semiconductor layer with a thickness of 3 nm to 15 nm is deposited, and first heat treatment is performed in a nitrogen, oxygen, rare gas, or dry air atmosphere at higher than or equal to 450° C. and lower than or equal to 850° C., preferably higher than or equal to 550° C. and lower than or equal to 750° C., so that the first oxide semiconductor layer having a crystalline region (including a plate-like crystal) is formed in a region including its surface. Then, a second oxide semiconductor layer which has a larger thickness than the first oxide semiconductor layer is formed, and second heat treatment is performed at higher than or equal to 450° C. and lower than or equal to 850° C., preferably higher than or equal to 600° C. and lower than or equal to 700° C., so that crystal growth proceeds upward with the first oxide semiconductor layer used as a seed of the crystal growth and the whole second oxide semiconductor layer is crystallized. In such a manner, the oxide semiconductor layer having a thick crystalline region can be obtained.

Next, a conductive film serving as a source electrode layer and a drain electrode layer (including a wiring formed using the same layer as these electrode layers) is formed over the gate insulating layer 507 and the oxide semiconductor layer 531. The conductive film serving as the source electrode layer and the drain electrode layer can be made of the material used for the source electrode layer 405a and the drain electrode layer 405b shown in Embodiment 3.

Figure 7C:
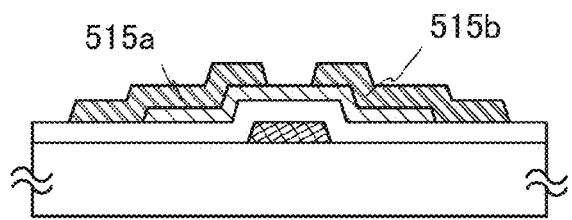

A resist mask is formed over the conductive film in a third photolithography step, and the source electrode layer 515a and the drain electrode layer 515b are formed by selective etching; then, the resist mask is removed (see FIG. 7C).

Light exposure at the time of the formation of the resist mask in the third photolithography step may be performed using ultraviolet light, KrF laser light, or ArF laser light. The channel length L of a transistor that is completed later is determined by the distance between bottom ends of the source electrode layer and the drain electrode layer, which are adjacent to each other over the oxide semiconductor layer 531. In the case where the channel length L is less than 25 nm, extreme ultraviolet light having an extremely short wavelength of several nanometers to several tens of nanometers may be used for light exposure at the time of formation of the resist mask in the third photolithography step. Light exposure using extreme ultraviolet enables high resolution and deep depth of focus. Thus, the channel length L of the transistor to be formed later can be longer than or equal to 10 nm and shorter than or equal to 1000 nm, and the circuit can operate at higher speed.

In order to reduce the number of photomasks and steps in the photolithography process, an etching step may be performed with the use of a multi-tone mask that is a light-exposure mask through which light is transmitted so as to have a plurality of intensities. A resist mask formed with the use of a multi-tone mask has a plurality of thicknesses and further can be changed in shape by etching; thus, the resist mask can be used in a plurality of etching steps for processing into different patterns. Consequently, a resist mask corresponding to at least two kinds or more of different patterns can be formed by one multi-tone mask. Thus, the number of light-exposure masks can be reduced and the number of corresponding photolithography steps can also be reduced, whereby simplification of a process can be realized.

Note that it is preferable that etching conditions be optimized so as not to etch and divide the oxide semiconductor layer 531 when the conductive film is etched. However, it is difficult to obtain the conditions under which only the conductive film is etched and the oxide semiconductor layer 531 is not etched at all. Therefore, at the time of etching of the conductive film, part of the oxide semiconductor layer 531 is etched in some cases to be an oxide semiconductor layer having a groove (a depressed portion).

In this embodiment, a Ti film is used as the conductive film and an In—Ga—Zn—O-based oxide semiconductor is used for the oxide semiconductor layer 531; thus, an ammonia hydrogen peroxide mixture (a mixed solution of ammonia, water, and a hydrogen peroxide solution) is used as an etchant.

Next, plasma treatment may be performed using a gas such as $N_2O$, $N_2$, or Ar, so that water or the like adsorbed to an exposed surface of the oxide semiconductor layer can be removed. In the case where the plasma treatment is performed, the insulating layer 516 serving as a protective insulating film in contact with part of the oxide semiconductor layer is formed without exposure to the air.

The insulating layer 516 can be formed to a thickness of at least 1 nm by a method such as a sputtering method, in which an impurity such as water or hydrogen does not enter the insulating layer 516. When hydrogen is contained in the insulating layer 516, entry of hydrogen to the oxide semiconductor layer, or extraction of oxygen in the oxide semiconductor layer by hydrogen may occur, thereby causing the backchannel of the oxide semiconductor layer to have lower resistance (to be n-type), so that a parasitic channel may be formed. Therefore, it is important that a formation method without using hydrogen be employed so that the insulating layer 516 contains hydrogen as little as possible.

In this embodiment, a silicon oxide film with a thickness of 300 nm is formed as the insulating layer 516 by a sputtering method. The substrate temperature in the film formation may be higher than or equal to room temperature and lower than or equal to 300° C.; in this embodiment, 100° C. The silicon oxide film can be formed by a sputtering method in a rare gas (typically, argon) atmosphere, an oxygen atmosphere, or a mixed atmosphere containing a rare gas and oxygen. As a target, a silicon oxide target or a silicon target may be used. For example, the silicon oxide film can be formed by a sputtering method using a silicon target in an atmosphere containing oxygen. The insulating film 516 is formed in contact with the oxide semiconductor layer, and is formed using an inorganic insulating film which does not contain impurities such as moisture, a hydrogen ion, and $OH^-$ and blocks entry of these from the outside. Typically, a silicon oxide film, a silicon oxynitride film, a gallium oxide film, an aluminum oxide film, an aluminum oxynitride film, or the like is used.

In order to remove moisture remaining in the deposition chamber of the insulating layer 516 as in the deposition of the oxide semiconductor layer 530, an entrapment vacuum pump (such as a cryopump) is preferably used. When the insulating layer 516 is formed in the deposition chamber evacuated using a cryopump, the impurity concentration in the insulating layer 516 can be reduced. As an exhaustion unit for removing moisture remaining in the deposition chamber of the insulating layer 516, a turbo molecular pump provided with a cold trap may also be used.

A high-purity gas from which impurities such as hydrogen, water, hydroxyl groups, or hydride have been removed is preferably used as a sputtering gas for forming the insulating film 516.

Next, second heat treatment (preferably at higher than or equal to 200° C. and lower than or equal to 400° C., for example, higher than or equal to 250° C. and lower than or equal to 350° C.) is performed in an inert gas atmosphere or an oxygen gas atmosphere. For example, the second heat treatment is performed in a nitrogen atmosphere at 250° C. for one hour. The second heat treatment is performed while part of the oxide semiconductor layer (a channel formation region) is in contact with the insulating layer 516.

Through the above steps, impurities such as hydrogen, moisture, hydroxyl groups, or hydride (also referred to as a hydrogen compound) can be intentionally eliminated from the oxide semiconductor layer in the first heat treatment performed on the oxide semiconductor film; and it is also possible to supply oxygen, which is one of the components of the oxide semiconductor and which has been reduced in the step of eliminating the impurities. Thus, a highly-purified and electrically i-type (intrinsic) oxide semiconductor layer is obtained.

Figure 7D:
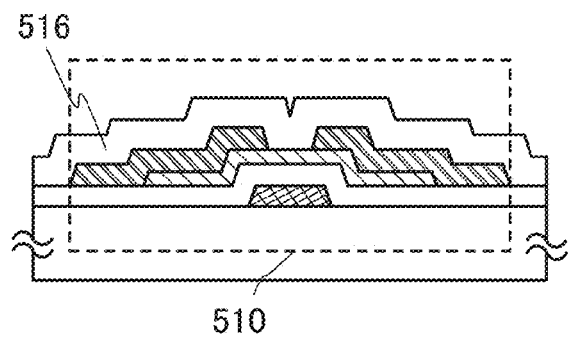
Figure 7E:
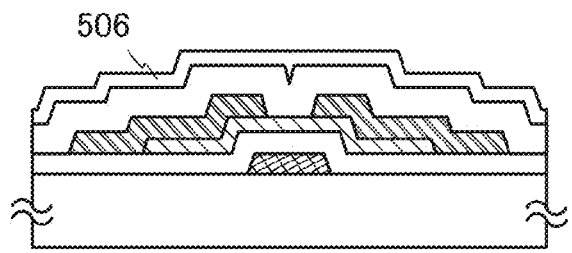

Through the above process, the transistor 510 is formed (see FIG. 7D).

When a silicon oxide layer having a lot of defects is used as the insulating layer 516, impurities such as hydrogen, moisture, hydroxyl groups, or hydride contained in the oxide semiconductor layer are diffused to the oxide insulating layer by heat treatment after the formation of the silicon oxide layer, so that the impurities in the oxide semiconductor layer can be further reduced.

A protective insulating layer 506 may be additionally formed over the insulating layer 516. For example, a silicon nitride film is formed by an RF sputtering method. The protective insulating layer is made using an inorganic insulating film that does not contain impurities such as moisture and blocks the entry of the impurities from the outside; for example, a silicon nitride film or an aluminum nitride film is used. In this embodiment, a silicon nitride film is formed as the protective insulating layer 506 (see FIG. 7E).

In this embodiment, as the protective insulating layer 506 serving as the protective insulating layer, a silicon nitride film is formed in the following manner: the substrate 505 over which the insulating layer 516 is formed is heated to a temperature of 100° C. to 400° C. inclusive; a sputtering gas containing high-purity nitrogen from which hydrogen and moisture have been removed is introduced; and a silicon target is used. Also in this step, it is preferable that the protective insulating layer 506 be formed while moisture remaining in the deposition chamber is removed as in the formation of the insulating layer 516.

After the formation of the protective insulating layer, heat treatment may be further performed in the air at a temperature of higher than or equal to 100° C. and lower than or equal to 200° C. for longer than or equal to 1 hour and shorter than or equal to 30 hours. This heat treatment may be performed at a fixed temperature. Alternatively, the following change in the heating temperature may be conducted plural times repeatedly: an increase from room temperature to a temperature of higher than or equal to 100° C. and lower than or equal to 200° C. and then a decrease to room temperature.

As described above, with the use of the transistor including a highly-purified oxide semiconductor layer manufactured using this embodiment, the current value in an off state (off-state current value) can be further reduced.

The capacitance of a storage capacitor provided in a liquid crystal display device is set in consideration of the leakage current or the like of a transistor placed in a pixel portion so that charges can be held for a predetermined period. The capacitance of the storage capacitor may be set in consideration of the off-state current or the like of the transistor. In the case of using the transistor described in this embodiment which includes a high-purity oxide semiconductor layer, it is only necessary to provide a storage capacitor having capacitance which is less than or equal to $\frac{1}{3}$, preferably less than or equal to $\frac{1}{5}$ of liquid crystal capacitance in each pixel.

Furthermore, the transistor including a highly-purified oxide semiconductor layer has a high field-effect mobility, which enables high-speed operation. Therefore, by using the transistor in a pixel portion of the liquid crystal display device, a high-quality image can be provided. Since the transistor can be separately formed over one substrate in a driver circuit portion and a pixel portion, the number of components can be reduced in the liquid crystal display device.

This embodiment can be implemented in appropriate combination with the structures described in the other embodiments.

(Embodiment 6)

An example of another material which can be used for the semiconductor layers of the transistors in Embodiments 2 to 5 will be described.

The semiconductor layer included in a semiconductor element can be formed using the following material: an amorphous semiconductor manufactured by a sputtering method or a vapor-phase growth method using a semiconductor material gas such as silane or germane; a polycrystalline semiconductor manufactured by crystallizing the amorphous semiconductor with the use of light energy or thermal energy; a microcrystalline semiconductor; or the like. The semiconductor layer can be formed by a sputtering method, an LPCVD method, a plasma CVD method, or the like.

The microcrystalline semiconductor film can be formed by a high-frequency plasma CVD method with a frequency of higher than or equal to several tens of MHz and lower than or equal to several hundreds of MHz or a microwave plasma CVD method with a frequency of 1 GHz or higher. Typically, the microcrystalline semiconductor film can be formed using silicon compound such as $SiH_4$, $Si_2H_6$, $SiH_2Cl_2$, $SiHCl_3$, $SiCl_4$, or $SiF_4$, which is diluted with hydrogen. In addition, the microcrystalline semiconductor film can be formed using the silicon compound that is diluted with hydrogen and one or more rare gas elements selected from helium, argon, krypton, and neon. In that case, the flow ratio of hydrogen to silicon compound is 5:1 to 200:1, preferably 50:1 to 150:1, further preferably 100:1.

A typical example of an amorphous semiconductor is hydrogenated amorphous silicon, and a typical example of a crystalline semiconductor is polysilicon and the like. Polysilicon (polycrystalline silicon) includes so-called high-temperature polysilicon that contains polysilicon formed at a process temperature of 800° C. or higher as its main component, so-called low-temperature polysilicon that contains polysilicon formed at a process temperature of 600° C. or lower as its main component, polysilicon formed by crystallizing amorphous silicon by using an element that promotes crystallization, or the like, and the like. As described above, a microcrystalline semiconductor or a semiconductor partly including a crystalline phase can also be used.

In the case of using a crystalline semiconductor film for the semiconductor layer, the crystalline semiconductor film may be manufactured by various methods (e.g., laser crystallization, thermal crystallization, or thermal crystallization using an element that promotes crystallization, such as nickel). Alternatively, a microcrystalline semiconductor, which is an SAS (Semi Amorphous Semiconductor), may be crystallized by laser irradiation to increase crystallinity. In the case where an element that promotes crystallization is not introduced, an amorphous silicon film is heated at 500° C. for one hour in a nitrogen atmosphere before being irradiated with laser light, whereby hydrogen contained in the amorphous silicon film is released to allow its concentration to be $1 \times 10^{20}$ atoms/cm$^3$ or less. This is because, if the amorphous silicon film contains much hydrogen, the amorphous silicon film is broken by laser irradiation.

There is no particular limitation on a method for introducing the metal element into an amorphous semiconductor film as long as the metal element can exist on the surface of or inside the amorphous semiconductor film. For example, a sputtering method, a CVD method, a plasma processing method (including a plasma CVD method), an adsorption method, or a method of applying a metal-salt solution can be employed. Among them, the method using a solution is easy and advantageous in that the concentration of the metal element can be easily controlled. At this time, an oxide film is preferably formed on the surface of the amorphous semiconductor film by UV light irradiation in an oxygen atmosphere, thermal oxidation, treatment with ozone-containing water or hydrogen peroxide including a hydroxyl radical, or the like in order to improve its wettability and to spread the solution over the entire surface of the amorphous semiconductor film.

In the step of crystallizing the amorphous semiconductor film to form a crystalline semiconductor film, an element that promotes crystallization (also referred to as a catalytic element or a metal element) may be added to the amorphous semiconductor film and heat treatment (at 550° C. to 750° C. for 3 minutes to 24 hours) may be performed for crystallization. As the element that accelerates (promotes) crystallization, it is possible to use one or more kinds of elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au).

In order to remove or reduce the element that promotes crystallization from the crystalline semiconductor film, a semiconductor film containing an impurity element is formed in contact with the crystalline semiconductor film so as to function as a gettering sink. As the impurity element, an impurity element imparting n-type conductivity, an impurity element imparting p-type conductivity, a rare gas element, or the like can be used. For example, one or more kinds of elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. A semiconductor film containing a rare gas element is formed in contact with the crystalline semiconductor film containing the element that promotes crystallization, and then heat treatment is performed (at 550° C. to 750° C. for 3 minutes to 24 hours). The element that promotes crystallization contained in the crystalline semiconductor film moves into the semiconductor film containing a rare gas element and is removed or reduced. After that, the semiconductor film containing a rare gas element, which has functioned as a gettering sink, is removed.

The amorphous semiconductor film may be crystallized by a combination of thermal treatment and laser light irradiation. Alternatively, either thermal treatment or laser light irradiation may be performed plural times.

A crystalline semiconductor film can also be formed directly over the substrate by a plasma method. Alternatively, a crystalline semiconductor film may be selectively formed over the substrate by a plasma method.

This embodiment can be implemented in appropriate combination with the structures described in the other embodiments.

(Embodiment 7)

In this embodiment, the appearance and cross section of a liquid crystal display device that is one embodiment of the liquid crystal display device will be described with reference to FIGS. 5A and 5B. FIGS. 5A and 5B are a top view and a cross-sectional view of a liquid crystal display device in which transistors 4010 and 4011 and a liquid crystal element 4013 including a liquid crystal layer 4008, which are formed over a first substrate 4001, are sealed between a first substrate 4001 and a second substrate 4006 with a sealant 4005.

Any of the transistors described in Embodiments 2 to 6 can be used as the transistors 4010 and 4011. The transistor can be used for a pixel portion, and further, for a driver circuit. Part of or whole of the driver circuit is formed over a substrate where the pixel portion is formed, whereby a system-on-panel can be obtained.

In FIG. 5A, a sealant 4005 is provided so as to surround a pixel portion 4002 and a scan line driver circuit 4004 provided over the first substrate 4001, and the pixel portion 4002 is sealed between the first substrate 4001 and the second substrate 4006. In FIG. 5A, a signal line driver circuit 4003 which is formed using a single crystal semiconductor or a polycrystalline semiconductor over a substrate separately prepared is mounted in a region different from the region surrounded by the sealant 4005 over the first substrate 4001. Further, a variety of signals and potentials are supplied to the signal line driver circuit 4003 which is separately formed, and the scan line driver circuit 4004 or the pixel portion 4002 from flexible printed circuits (FPC) 4018.

Although FIG. 5A shows the example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method or the like can be used. FIG. 5A illustrates an example in which the signal line driver circuit 4003 and the scan line driver circuit 4004 are mounted by a COG method.

Further, a liquid crystal display device includes a panel in which a display element is sealed, and a module in which an IC or the like including a controller is mounted to the panel.

Note that a display device in this embodiment means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

Further, the pixel portion 4002 and the scan line driver circuit 4004 which are provided over the first substrate 4001 include a plurality of transistors, to which the transistor whose example is described in Embodiments 2 to 6 can be applied. FIG. 5B shows the transistor 4010 included in the pixel portion 4002 and the transistor 4011 included in the scan line driver circuit 4004.

Further, a conductive layer, which is not shown, may be provided over the insulating layer so as to overlap with a channel formation region of a semiconductor layer of the transistor for a driver circuit. The conductive layer is provided so as to overlap with the channel formation region of the oxide semiconductor layer, whereby the amount of change in the threshold voltage of the transistor can be reduced. In addition, the conductive layer may have the same potential as or a potential different from that of a gate electrode layer of the transistor and can function as a second gate electrode layer. The potential of the conductive layer may be GND, 0V, or in a floating state.

The conductive layer also functions to block an external electric field, that is, to prevent an external electric field (particularly, to prevent static electricity) from effecting the inside (a circuit portion including a transistor). A blocking function of the conductive layer can prevent the variation in electrical characteristics of the transistor due to the effect of external electric field such as static electricity.

In FIGS. 5A and 5B, a connection terminal electrode 4015 is formed using the same conductive film as that of a pixel electrode layer 4030, and a terminal electrode 4016 is formed using the same conductive film as that of source and drain electrode layers of the transistor 4010.

The connection terminal electrode 4015 is electrically connected to a terminal included in the FPC 4018 via an anisotropic conductive film 4019.

In this embodiment, the liquid crystal display device is a reflective type in which images are displayed by reflecting external light. Thus, at least in the pixel region, a substrate, an electrode layer and an insulating layer provided on the viewer side need to transmit light. Accordingly, the substrate and the thin films such as insulating layers and conductive layers existing in the pixel region through which light passes have light-transmitting properties in the visible wavelength range. On the other hand, on the opposite side to the viewer side that transmits light, an electrode layer, a film, and the like, which have reflective properties are provided.

Note that in the liquid crystal display device in FIGS. 5A and 5B, the viewer side is the second substrate 4006 side.

In this embodiment, a common electrode layer 4031 is formed using a light-transmitting conductive material. For example, a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added can be used.

A conductive composition including a conductive macromolecule (also referred to as a conductive polymer) can be used for the common electrode layer 4031.

The pixel electrode layer 4030 can be formed using a reflective conductive material, and one or more kinds of materials selected from metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof can be used.

A guest-host liquid crystal is used for the liquid crystal layer 4008 in the liquid crystal element 4013. The liquid crystal layer 4008 may be formed using a material and a method similar to those of the liquid crystal layer 205 described in Embodiment 1.

In the liquid crystal layer 4008, when voltage is not applied between the pixel electrode layer 4030 and the common electrode layer 4031, incident light is absorbed by a guest molecule of a dichroic pigment that is dispersed in the guest-host liquid crystal, whereby black is displayed. On the other hand, when voltage is applied between the pixel electrode layer 4030 and the common electrode layer 4031, electric field is formed in the liquid crystal layer 4008, and a host molecule and a guest molecule of a dichroic pigment in the liquid crystal layer are arranged in matrix, whereby incident light transmits the liquid crystal layer 4008. Thus, the liquid crystal layer 4008 becomes a transparent state and the pixel electrode layer 4030 has a reflective property, whereby white is displayed.

In addition, the pixel electrode layer 4030 is provided over the insulating layer 4021. Further, the insulating layer 4021 has a first unevenness and a second unevenness, and the pixel electrode layer 4030 also has unevenness in accordance with the unevenness on the insulating layer 4021. Note that the insulating layer 4021 having the first unevenness and the second unevenness can be formed using a material and a method similar to those of the insulating layer 202 described in Embodiment 1.

Note that the insulating layer 4021 and the pixel electrode layer 4030 shown in FIG. 5B have the nano-sized second unevenness; however, it is difficult to recognize in the drawing. Note that, the insulating layer 4021 and the pixel electrode layer 4030 can be formed using a material and a method similar to those of the insulating layer 417 and the pixel electrode layer 414 described in Embodiment 1.

In addition, an alignment film 4033 is formed over the pixel electrode layer 4030, and similarly an alignment film 4032 is formed over the common electrode layer 4031.

Since the insulating layer 4021 is also used as an interlayer film of the transistor, a contact hole 4007 is formed in the insulating layer 4021. The nano-sized second unevenness is not shown in the contact hole 4007 in FIG. 5B; however, the nano-sized second unevenness may be formed in the contact hole.

In the liquid crystal display device described in this embodiment, the pixel electrode layer 4030 is formed over the insulating layer 4021 having the first unevenness and the second unevenness. Thus, light incident on the pixel electrode layer 4030 can be reflected in various directions to the liquid crystal layer 4008 side. Accordingly, light is efficiently scattered by the liquid crystal layer 4008, whereby white can be favorably displayed.

Further, the liquid crystal layer 4008 includes a guest-host liquid crystal. Since polarization of the incident light is not needed in a guest-host liquid crystal, a polarizing plate is not necessarily provided.

Thus, light absorption by a polarizing plate is not performed in a liquid crystal display device using a guest-host liquid crystal, whereby the display screen can increase in brightness. Thus, power consumption can be reduced because light use efficiency is high. Further, the number of manufacturing steps and cost can be reduced, so that higher throughput and lower cost can be realized. Accordingly, it is further effective to use a guest-host liquid crystal material to a liquid crystal display device including a transistor.

Note that as the first substrate 4001 and the second substrate 4006, glass, plastic, or the like having a light-transmitting property can be used. As plastic, a fiberglass-reinforced plastics (FRP) plate, a polyvinyl fluoride (PVF) film, a polyester film, or an acrylic resin film can be used.

A columnar spacer 4035 is obtained by selective etching of an insulating film and is provided in order to control the thickness (a cell gap) of the liquid crystal layer 4008. Alternatively, a spherical spacer may also be used. In the liquid crystal display device including the liquid crystal layer 4008, the thickness of the liquid crystal layer (the cell gap) may be greater than or equal to 5 μm and less than or equal to 30 (preferably greater than or equal to 10 μm and less than or equal to 20 μm).

In addition, in this embodiment, the transistors are covered with the insulating layer 4020 functioning as a protective film of the transistors; however, there is no particular limitation thereto, and the protective film is not necessarily provided.

Note that the protective film is provided to prevent entry of contaminant impurities such as organic substance, metal, or moisture floating in the air and is preferably a dense film. The protective film may be formed with a single-layer structure or a stacked-layer structure using any of a silicon oxide film, a silicon nitride film, a silicon oxynitride film, a silicon nitride oxide film, a gallium oxide film, an aluminum oxide film, an aluminum nitride film, an aluminum oxynitride film, and an aluminum nitride oxide film by a sputtering method.

Further, the insulating layer 4021 provided over the insulating layer 4020 can be formed using an organic material having heat resistance such as polyimide, acrylic, benzocyclobutene, polyamide, or epoxy. Other than such organic materials, a low-dielectric constant material (a low-k material), a siloxane-based resin, or the like can be used. Note that the insulating layer may be formed by stacking a plurality of insulating films formed of these materials.

There is no particular limitation on the method for forming the insulating layers to be stacked, and the following method can be employed depending on the material: a sputtering method, spin coating, dip coating, spray coating, droplet discharging (such as ink jetting, screen printing, or offset printing), roll coating, curtain coating, knife coating, or the like.

Further, in the liquid crystal display device, an optical member (an optical substrate), and the like may be provided as appropriate.

Further, since the transistor is easily broken by static electricity and the like, a protection circuit for protecting driver circuits is preferably provided over the same substrate for a gate line or a source line. The protection circuit is preferably formed using a nonlinear element.

This embodiment can be implemented in appropriate combination with the structures described in the other embodiments.

(Embodiment 8)

A liquid crystal display device disclosed in this specification can be applied to a variety of electronic devices. Particularly, in the liquid crystal display device disclosed in this specification, a guest-host liquid crystal is used in the liquid crystal layer, black is displayed by absorbing light by a dichroic pigment of a guest molecule, and white is displayed by scattering light by a reflective pixel electrode layer, so that the liquid crystal display device has favorable image quality equivalent to paper, is eye-friendly, and is preferably applied to an electronic paper. An electronic paper can be used for electronic appliances for displaying data in various fields. For example, electronic paper can be used for electronic book (an e-book reader), posters, advertisement in vehicles such as trains, and so on.

Further, as other examples of an electronic device, a digital photo frame, a mobile phone (also referred to as a cellular phone or a cellular phone device), and the like can be given. Examples of electronic devices each including the liquid crystal display device described in the above embodiment will be described.

Figure 8A:
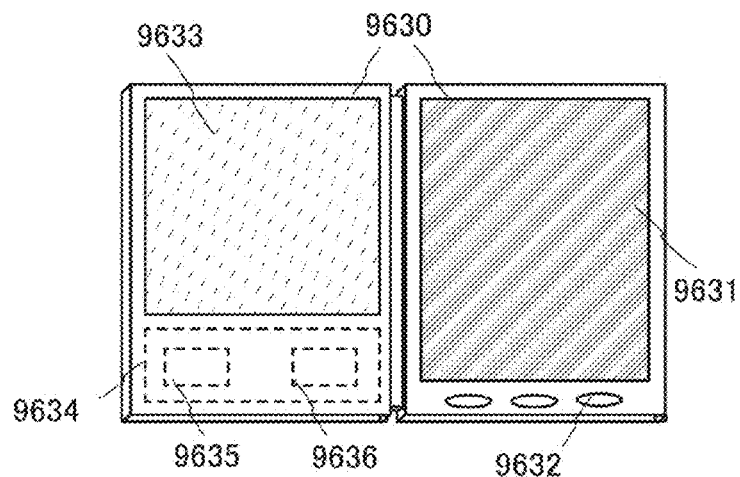
FIGS. 8A and 8B are diagrams showing an electronic device.

FIG. 8A illustrates an electronic book reader (also referred to as an e-book) which can include housings 9630, a display portion 9631, operation keys 9632, a solar cell 9633, and a charge and discharge control circuit 9634. The electronic book reader illustrated in FIG. 8A can have a function of displaying various kinds of information (such as a still image, a moving image, and a text image), a function of displaying a calendar, a date, time, or the like on the display portion, a function of operating or editing the information displayed on the display portion, a function of controlling processing by various kinds of software (programs), and the like. Note that in FIG. 8A, a battery 9635 and a DCDC converter 9636 (hereinafter abbreviated to a converter) are included in the charge and discharge control circuit 9634, as an example. The liquid crystal display device described in any of Embodiments 1 to 7 is used for the display portion 9631, whereby an electronic book reader with high visibility and high image quality can be provided. Thus, the electronic book reader is easy on users' eyes and it leads to reduction of eyestrain.

With the structure shown in FIG. 8A, when a reflective liquid crystal display device is used as the display portion 9631, the electronic book reader may be used in a comparatively bright environment. In that case, power generation by the solar cell 9633 and charge by the battery 9635 can be effectively performed, which is preferable. Since the solar cell 9633 can be provided on a space (a surface or a rear surface) of the housing 9630 as appropriate, the battery 9635 can be efficiently charged, which is preferable. When a lithium ion battery is used for the battery 9635, there is an advantage of downsizing or the like.

Figure 8B:
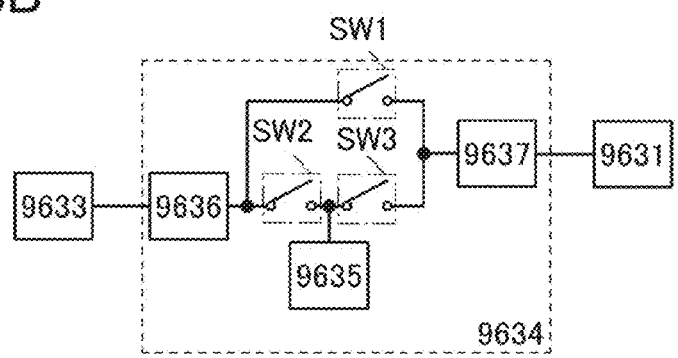

The structure and the operation of the charge and discharge control circuit 9634 illustrated in FIG. 8A will be described with reference to a block diagram in FIG. 8B. The solar cell 9633, the battery 9635, the converter 9636, a converter 9637, switches SW1 to SW3, and the display portion 9631 are illustrated in FIG. 8B, and the battery 9635, the converter 9636, the converter 9637, and the switches SW1 to SW3 correspond to the charge and discharge control circuit 9634.

First, an example of operation in the case where power is generated by the solar battery 9633 using external light is described. The voltage of power generated by the solar battery is raised or lowered by the converter 9636 so that the power has a voltage for charging the battery 9635. Then, when the power from the solar battery 9633 is used for the operation of the display portion 9631, the switch SW1 is turned on and the voltage of the power is raised or lowered by the converter 9637 so as to be a voltage needed for the display portion 9631. In addition, when display on the display portion 9631 is not performed, the switch SW1 is turned off and a switch SW2 is turned on so that charge of the battery 9635 may be performed.

Next, an example of operation in the case where power is not generated by the solar battery 9633 utilizing external light is described. The voltage of power accumulated in the battery 9635 is raised or lowered by the converter 9637 by turning on the switch SW3. Then, power from the battery 9635 is used for the operation of the display portion 9631.

Note that although the solar battery 9633 is described as an example of a means for charge, charge of the battery 9635 may be performed with another means. In addition, a combination of the solar battery 9633 and another means for charge may be used.

Figure 9A:
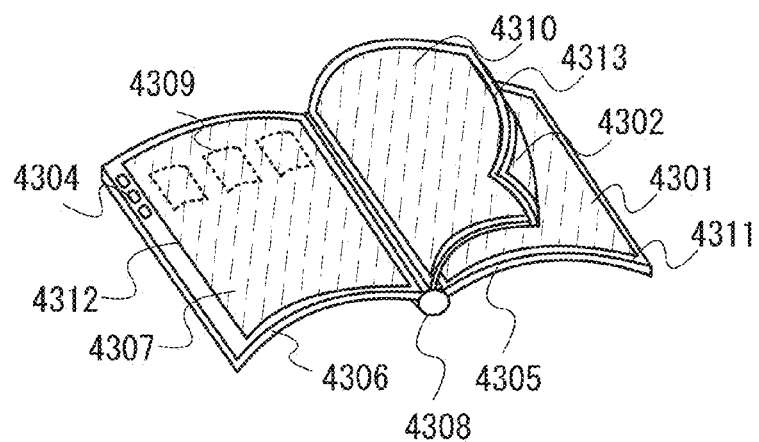
FIGS. 9A and 9B are diagrams each showing an electronic device.
Figure 9B:
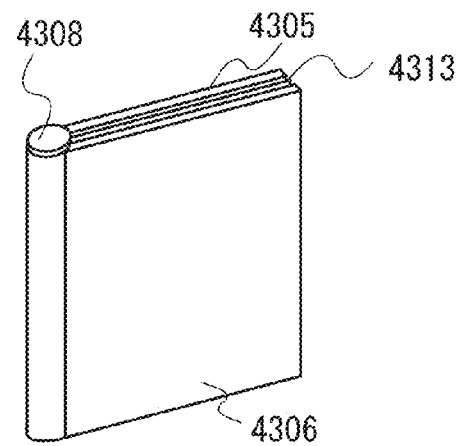

FIGS. 9A and 9B show an example of a flexible electronic book reader using the liquid crystal display device formed according to any of the above embodiments. FIG. 9A illustrates an opened electronic book reader and FIG. 9B illustrates a closed electronic book reader. The liquid crystal display device formed according to any of the above embodiments can be used for a first display panel 4311, a second display panel 4312, and a third display panel 4313. By using the liquid crystal display device, an electronic book reader with high visibility and high image quality can be provided. Thus, the electronic book reader is easy on users' eyes and it leads to reduction of eyestrain.

A first housing 4305 has the first display panel 4311 including a first display portion 4301, a second housing 4306 has the second display panel 4312 including an operation portion 4304 and a second display portion 4307. The third display panel 4313 is a dual display type panel and has a third display portion 4302 and a fourth display portion 4310. The third display panel 4313 is provided between the first display panel 4311 and the second display panel 4312. The first housing 4305, the first display panel 4311, the third display panel 4313, the second display panel 4312, and the second housing 4306 are connected to one other with a binding portion 4308 in which a driving portion is formed. The electronic book reader of FIGS. 9A and 9B includes four display screens of the first display portion 4301, the second display portion 4307, the third display portion 4302, and the fourth display portion 4310.

The first housing 4305, the first display panel 4311, the third display panel 4313, the second display panel 4312, and the second housing 4306 each has high flexibility. Further, when a plastic substrate is used for each of the first housing 4305 and the second housing 4306, and a thin film is used for the third display panel 4313, a thin electronic book reader can be obtained.

The third display panel 4313 is a dual display panel including the third display portion 4302 and the fourth display portion 4310. The third display panel 4313 may be obtained by attaching one-side emission display panels. In addition, the electronic book reader can be a two-screen type without the third display panel 4313.

This embodiment can be implemented in appropriate combination with the structures described in the other embodiments.

EXAMPLE 1

In this example, the second unevenness was formed by the plasma apparatus described in FIGS. 2A and 2B in Embodiment 1. Hereinafter, detailed description will be made with reference to FIG. 3.

Figure 3:
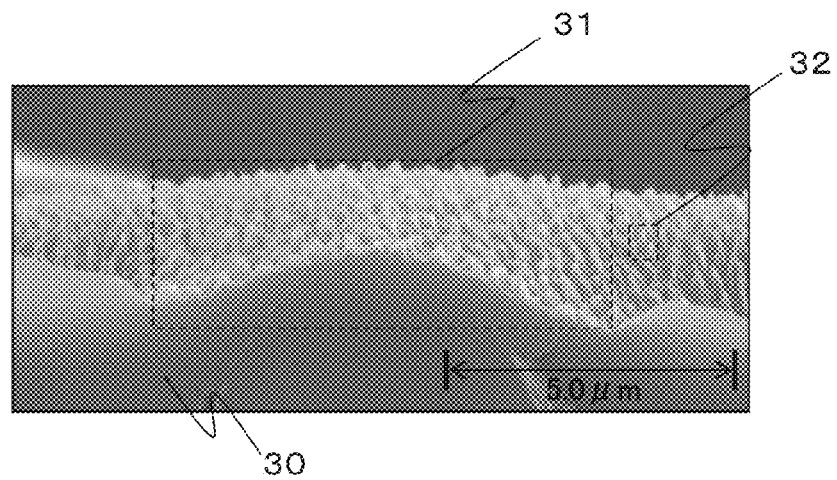
FIG. 3 is a cross-sectional SEM image of an uneven surface that is an embodiment of the present invention.

FIG. 3 is a cross-sectional SEM (Scanning Electron Microscope) photograph of the second unevenness formed in this example.

Note that an insulating layer 30, a first unevenness 31, and a second unevenness 32 in the cross-sectional photograph of FIG. 3 correspond to the insulating layer 202, the first unevenness 210, and the second unevenness 211 described in Embodiment 1, respectively.

Referring to FIG. 3, the first unevenness 31 and the second unevenness 32 are formed on the insulating layer 30. Note that the first unevenness 31 was formed using a photosensitive organic resin by photolithography in this example. In addition, the second unevenness 32 was formed by performing plasma treatment under an oxygen gas atmosphere using the plasma apparatus described in FIG. 2 in Embodiment 1.

As described above, it was confirmed that the second unevenness 32 was formed by performing plasma treatment on the insulating layer 30 having the first unevenness 31 under an oxygen gas atmosphere.

This example can be implemented in appropriate combination with any of the structures described in the other embodiments.

This application is based on the Japanese Patent Application serial No. 2010-115983 filed with Japan Patent Office on May 20, 2010, the entire contents of which are hereby incorporated by reference.

What is claimed is:

1. A manufacturing method of a display device, comprising the steps of:
    preparing a substrate;
    forming a photosensitive organic resin layer over the substrate, the photosensitive organic resin layer having a first unevenness on a face of the photosensitive organic resin layer;
    forming a contact hole in a part of the photosensitive organic resin layer;
    performing a plasma treatment on the photosensitive organic resin layer, whereby forming a second unevenness on a face of the first unevenness and a fourth unevenness on a face of the part of the photosensitive organic resin layer; and
    forming a reflective pixel electrode layer over the photosensitive organic resin layer, the reflective pixel electrode layer having a third unevenness formed in accordance with the first unevenness, the second unevenness and the fourth unevenness,
    wherein a whole size of the first unevenness is greater than that of the second unevenness or the fourth unevenness, and
    wherein each of the second unevenness and the fourth unevenness is provided in higher density than the first unevenness.

2. The manufacturing method of a display device according to claim 1, wherein the plasma treatment is performed on the photosensitive organic resin layer under an oxygen gas atmosphere.

3. The manufacturing method of a display device according to claim 1, wherein the first unevenness has a size of greater than or equal to 1.5 μm and less than or equal to 20μm in a planar direction, and
    wherein the second unevenness has a size of greater than or equal to 0.1μm and less than or equal to 1 μm in the planar direction.

4. The manufacturing method of a display device according to claim 1, wherein the first unevenness has a height of greater than or equal to 0.1μm and less than or equal to 20μm, and
    wherein the second unevenness has a height of greater than or equal to 0.1μm and less than or equal to 1 μm.

5. The manufacturing method of a display device according to claim 1, wherein the display device is a liquid crystal display device.

6. A manufacturing method of a display device, comprising the steps of:
    forming an insulating layer over a transistor;
    forming a contact hole in a part of the insulating layer;
    performing a plasma treatment on a first unevenness of the insulating layer, so that a plurality of second unevennesses are formed on the first unevenness and a plurality of fourth unevennesses are formed on a face of the part of the insulating layer; and
    forming a pixel electrode layer over the insulating layer, the pixel electrode layer electrically connected to one of a source and a drain of the transistor and having a third unevenness formed in accordance with the first unevenness, the second unevennesses and the fourth unevennesses,
    wherein a whole size of the first unevenness is greater than that of the second unevenness, and
    wherein each of the second unevenness and the fourth unevenness is provided in higher density than the first unevenness.

7. The manufacturing method of a display device according to claim 6, wherein the insulating layer comprises a photosensitive organic resin.

8. The manufacturing method of a display device according to claim 6, wherein the pixel electrode layer is in contact with the insulating layer.

9. The manufacturing method of a display device according to claim 6, wherein the plasma treatment is performed under an oxygen gas atmosphere.

10. The manufacturing method of a display device according to claim 6,
    wherein the first unevenness has a size of greater than or equal to 1.5μm and less than or equal to 20 μm in a planar direction, and
    wherein each of the second unevennesses has a size of greater than or equal to 0.1μm and less than or equal to 1μm in the planar direction.

11. The manufacturing method of a display device according to claim 6, wherein the first unevenness has a height of greater than or equal to 0.1μm and less than or equal to 20μm, and
    wherein each of the second unevennesses has a height of greater than or equal to 0.1μm and less than or equal to 1 μm.

12. The manufacturing method of a display device according to claim 6, wherein the display device is a liquid crystal display device.

* * * * *